United States Patent
Kister

(10) Patent No.: US 8,203,353 B2
(45) Date of Patent: *Jun. 19, 2012

(54) PROBES WITH OFFSET ARM AND SUSPENSION STRUCTURE

(75) Inventor: January Kister, Portola Valley, CA (US)

(73) Assignee: MicroProbe, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/777,827

(22) Filed: May 11, 2010

(65) Prior Publication Data

US 2010/0289512 A1 Nov. 18, 2010

Related U.S. Application Data

(63) Continuation of application No. 11/480,302, filed on Jun. 29, 2006, now Pat. No. 7,759,949, which is a continuation-in-part of application No. 10/888,347, filed on Jul. 9, 2004, now Pat. No. 7,091,729.

(51) Int. Cl.
*G01R 1/067* (2006.01)
*G01R 31/20* (2006.01)
(52) U.S. Cl. ......... 324/755.01; 324/754.11; 324/755.07; 324/756.04
(58) Field of Classification Search .................. None
See application file for complete search history.

(56) References Cited

U.S. PATENT DOCUMENTS

| | | | |
|---|---|---|---|
| 3,518,612 A | 6/1970 | Dunman et al. | |
| 3,599,093 A | 8/1971 | Oates | |
| 3,710,251 A | 1/1973 | Hagge et al. | |
| 3,812,311 A | 5/1974 | Kvaternik | |
| 4,027,935 A | 6/1977 | Byrnes et al. | |

(Continued)

FOREIGN PATENT DOCUMENTS

EP 0764352 5/2004

(Continued)

OTHER PUBLICATIONS

Levy, Larry, "Water Probe TM System", *Southwest Workshop* formfactor inc. Jun. 1997, 1-19

(Continued)

*Primary Examiner* — Vinh Nguyen
(74) *Attorney, Agent, or Firm* — Deborah A. Peacock; Samantha A. Updegraff; Peacock Myers, P.C.

(57) ABSTRACT

A probe having a conductive body and a contacting tip that is terminated by one or more blunt skates for engaging a conductive pad of a device under test (DUT) for performing electrical testing. The contacting tip has a certain width and the blunt skate is narrower than the tip width. The skate is aligned along a scrub direction and also has a certain curvature along the scrub direction such that it may undergo both a scrub motion and a self-cleaning rotation upon application of a contact force between the skate and the conductive pad. While the scrub motion clears oxide from the pad to establish electrical contact, the rotation removes debris from the skate and thus preserves a low contact resistance between the skate and the pad. The use of probes with one or more blunt skates and methods of using such self-cleaning probes are especially advantageous when testing DUTs with low-K conductive pads or other mechanically fragile pads that tend to be damaged by large contact force concentration.

70 Claims, 14 Drawing Sheets

U.S. PATENT DOCUMENTS

| | | | |
|---|---|---|---|
| 4,115,736 A | 9/1978 | Tracy | |
| 4,116,523 A | 9/1978 | Coberly et al. | |
| 4,525,697 A | 6/1985 | Jones et al. | |
| 4,532,423 A | 7/1985 | Tojo et al. | |
| 4,567,433 A | 1/1986 | Ohkubo et al. | |
| 4,593,961 A | 6/1986 | Cosmo | |
| 4,618,767 A | 10/1986 | Smith et al. | |
| 4,618,821 A | 10/1986 | Lenz | |
| 4,706,019 A | 11/1987 | Richardson | |
| 4,730,158 A | 3/1988 | Kasai et al. | |
| 4,747,698 A | 5/1988 | Wickramasinghe et al. | |
| 4,757,255 A | 7/1988 | Margozzi | |
| 4,772,846 A | 9/1988 | Reeds | |
| 4,773,877 A | 9/1988 | Kruger et al. | |
| 4,807,159 A | 2/1989 | Komatsu et al. | |
| 4,901,013 A | 2/1990 | Benedetto et al. | |
| 4,967,148 A | 10/1990 | Doemens et al. | |
| 5,015,947 A | 5/1991 | Chism | |
| 5,026,291 A | 6/1991 | David | |
| 5,030,318 A | 7/1991 | Reche | |
| 5,061,192 A | 10/1991 | Chapin et al. | |
| 5,067,007 A | 11/1991 | Otsuka et al. | |
| 5,145,384 A | 9/1992 | Asakawa et al. | |
| 5,205,739 A | 4/1993 | Malo et al. | |
| 5,207,585 A | 5/1993 | Byrnes | |
| 5,225,771 A | 7/1993 | Leedy | |
| 5,230,632 A | 7/1993 | Baumberger et al. | |
| 5,237,743 A | 8/1993 | Busacco et al. | |
| 5,354,205 A | 10/1994 | Feigenbaum et al. | |
| 5,399,982 A | 3/1995 | Driller | |
| 5,422,574 A | 6/1995 | Kister | |
| 5,430,614 A | 7/1995 | Difrancesco | |
| 5,436,571 A | 7/1995 | Karasawa | |
| 5,476,211 A | 12/1995 | Khandros | |
| 5,531,022 A | 7/1996 | Beaman et al. | |
| 5,576,631 A | 11/1996 | Stowers et al. | |
| 5,632,631 A | 5/1997 | Fjelstad et al. | |
| 5,635,846 A | 6/1997 | Beaman et al. | |
| 5,644,249 A | 7/1997 | Kister | |
| 5,676,599 A | 10/1997 | Ricks et al. | |
| 5,701,085 A | 12/1997 | Malladi | |
| 5,720,098 A | 2/1998 | Kister | |
| 5,742,174 A | 4/1998 | Kister et al. | |
| 5,751,157 A | 5/1998 | Kister | |
| 5,764,070 A | 6/1998 | Pedder | |
| 5,764,072 A | 6/1998 | Kister | |
| 5,764,409 A | 6/1998 | Colvin | |
| 5,767,691 A | 6/1998 | Verkuil | |
| 5,772,451 A | 6/1998 | Dozier, II et al. | |
| 5,773,987 A | 6/1998 | Montoya | |
| 5,802,699 A | 9/1998 | Fjelstad et al. | |
| 5,806,181 A | 9/1998 | Khandros et al. | |
| 5,821,763 A | 10/1998 | Beamann et al. | |
| 5,829,128 A | 11/1998 | Eldridge et al. | |
| 5,832,601 A | 11/1998 | Eldridge et al. | |
| 5,834,946 A | 11/1998 | Albrow et al. | |
| 5,847,936 A | 12/1998 | Forehand | |
| 5,852,871 A | 12/1998 | Khandros | |
| 5,864,946 A | 2/1999 | Eldridge et al. | |
| 5,884,395 A | 3/1999 | Dabrowiecki et al. | |
| 5,892,539 A | 4/1999 | Colvin | |
| 5,914,613 A | 6/1999 | Gleason et al. | |
| 5,917,707 A | 6/1999 | Khandros et al. | |
| 5,923,178 A | 7/1999 | Higgins et al. | |
| 5,926,951 A | 7/1999 | Khandros et al. | |
| 5,932,323 A | 8/1999 | Throssel | |
| 5,934,914 A | 8/1999 | Fjelstad et al. | |
| 5,936,421 A | 8/1999 | Stowers et al. | |
| 5,945,836 A | 8/1999 | Sayre et al. | |
| 5,952,843 A | 9/1999 | Vinh | |
| 5,969,533 A | 10/1999 | Takagi | |
| 5,970,167 A | 10/1999 | Colvin | |
| 5,974,662 A | 11/1999 | Eldridge et al. | |
| 5,994,152 A | 11/1999 | Khandros et al. | |
| 6,027,630 A | 2/2000 | Cohen | |
| 6,029,344 A | 2/2000 | Khandros et al. | |
| 6,031,282 A | 2/2000 | Jones et al. | |
| 6,064,215 A | 5/2000 | Kister | |
| 6,066,957 A | 5/2000 | Van Loan et al. | |
| 6,086,386 A | 7/2000 | Fjelstad et al. | |
| 6,133,072 A | 10/2000 | Fjelstad | |
| 6,184,576 B1 | 2/2001 | Jones et al. | |
| 6,204,674 B1 | 3/2001 | Dabrowiecki et al. | |
| 6,205,660 B1 | 3/2001 | Fjelstad et al. | |
| 6,215,320 B1 | 4/2001 | Parrish | |
| 6,218,203 B1 | 4/2001 | Khoury et al. | |
| 6,246,245 B1 | 6/2001 | Akram et al. | |
| 6,246,247 B1 | 6/2001 | Eldridge et al. | |
| 6,247,228 B1 | 6/2001 | Distefano et al. | |
| 6,255,126 B1 | 7/2001 | Mathieu et al. | |
| 6,259,261 B1 | 7/2001 | Engelking et al. | |
| 6,278,284 B1 | 8/2001 | Mori et al. | |
| 6,292,003 B1 | 9/2001 | Fredrickson et al. | |
| 6,336,259 B1 | 1/2002 | Eldridge et al. | |
| 6,344,753 B1 | 2/2002 | Takada et al. | |
| 6,411,112 B1 * | 6/2002 | Das et al. | 324/754.2 |
| 6,419,500 B1 | 7/2002 | Kister | |
| 6,420,887 B1 | 7/2002 | Kister et al. | |
| 6,424,164 B1 | 7/2002 | Kister | |
| 6,437,584 B1 | 8/2002 | Gleason et al. | |
| 6,441,315 B1 | 8/2002 | Eldridge et al. | |
| 6,443,784 B1 | 9/2002 | Kimoto | |
| 6,482,013 B2 | 11/2002 | Eldridge et al. | |
| 6,483,328 B1 | 11/2002 | Eldridge et al. | |
| 6,486,689 B1 | 11/2002 | Nishikawa | |
| 6,525,552 B2 | 2/2003 | Kister | |
| 6,529,021 B1 | 3/2003 | Yu et al. | |
| 6,530,148 B1 | 3/2003 | Kister | |
| 6,566,898 B2 | 5/2003 | Theissen et al. | |
| 6,570,396 B1 | 5/2003 | Kister | |
| 6,573,738 B1 | 6/2003 | Matsuo et al. | |
| 6,575,767 B2 | 6/2003 | Satoh et al. | |
| 6,576,485 B2 | 6/2003 | Zhou et al. | |
| 6,586,955 B2 | 7/2003 | Fjelstad et al. | |
| 6,615,485 B2 | 9/2003 | Eldridge et al. | |
| 6,624,648 B2 | 9/2003 | Eldridge et al. | |
| 6,633,176 B2 | 10/2003 | Takemoto et al. | |
| 6,641,430 B2 | 11/2003 | Zhou et al. | |
| 6,646,455 B2 | 11/2003 | Maekawa et al. | |
| 6,676,438 B2 | 1/2004 | Zhou et al. | |
| 6,677,245 B2 | 1/2004 | Zhou et al. | |
| 6,690,185 B1 | 2/2004 | Khandros et al. | |
| 6,701,630 B2 | 3/2004 | Humphrey | |
| 6,707,311 B2 | 3/2004 | Hohenwarter | |
| 6,727,719 B2 | 4/2004 | Liao et al. | |
| 6,731,123 B2 | 5/2004 | Kimoto | |
| 6,765,228 B2 | 7/2004 | Lin et al. | |
| 6,825,422 B2 | 11/2004 | Eldridge et al. | |
| 6,842,023 B2 | 1/2005 | Yoshida et al. | |
| 6,847,221 B2 | 1/2005 | Kimoto et al. | |
| 6,853,208 B2 | 2/2005 | Okubo et al. | |
| 6,881,974 B2 | 4/2005 | Wood et al. | |
| 6,890,185 B1 | 5/2005 | Kister et al. | |
| 6,897,666 B2 | 5/2005 | Swettlen et al. | |
| D507,198 S | 7/2005 | Kister | |
| 6,917,102 B2 | 7/2005 | Zhou et al. | |
| 6,917,525 B2 | 7/2005 | Mok et al. | |
| D510,043 S | 9/2005 | Kister | |
| 6,945,827 B2 | 9/2005 | Grube et al. | |
| 6,956,389 B1 | 10/2005 | Mai | |
| 6,965,244 B2 | 11/2005 | Miller | |
| 6,965,245 B2 | 11/2005 | Kister et al. | |
| 6,970,005 B2 | 11/2005 | Rincon et al. | |
| 7,015,707 B2 | 3/2006 | Cherian | |
| 7,046,021 B2 | 5/2006 | Kister | |
| 7,059,865 B2 | 6/2006 | Kister et al. | |
| 7,064,564 B2 | 6/2006 | Kister et al. | |
| D525,207 S | 7/2006 | Kister et al. | |
| 7,071,715 B2 | 7/2006 | Shinde et al. | |
| 7,073,254 B2 | 7/2006 | Eldridge et al. | |
| 7,078,921 B2 | 7/2006 | Haga et al. | |
| 7,088,118 B2 | 8/2006 | Liu et al. | |
| 7,091,729 B2 | 8/2006 | Kister | |
| 7,108,546 B2 | 9/2006 | Miller et al. | |
| 7,109,731 B2 | 9/2006 | Gleason et al. | |
| 7,126,361 B1 | 10/2006 | Anderson et al. | |
| 7,148,709 B2 | 12/2006 | Kister | |

| | | |
|---|---|---|
| 7,150,658 B1 | 12/2006 | Chien |
| 7,173,441 B2 | 2/2007 | Kister et al. |
| 7,189,078 B2 | 3/2007 | Kister et al. |
| 7,202,682 B2 | 4/2007 | Cooper et al. |
| 7,217,138 B2 | 5/2007 | Kister et al. |
| 7,218,127 B2 | 5/2007 | Cooper et al. |
| 7,218,131 B2 | 5/2007 | Tanioka et al. |
| 7,225,538 B2 | 6/2007 | Eldridge et al. |
| 7,227,371 B2 | 6/2007 | Miller |
| 7,265,565 B2 | 9/2007 | Chen et al. |
| 7,274,195 B2 | 9/2007 | Takemoto et al. |
| 7,285,966 B2 | 10/2007 | Lee et al. |
| 7,312,617 B2 | 12/2007 | Kister |
| 7,345,492 B2 | 3/2008 | Kister |
| 7,417,447 B2 | 8/2008 | Kister |
| 7,436,192 B2 | 10/2008 | Kister |
| 7,511,523 B2 | 3/2009 | Chen et al. |
| 7,514,948 B2 | 4/2009 | Kister |
| 7,649,367 B2 | 1/2010 | Kister |
| 7,659,739 B2 | 2/2010 | Kister |
| 7,759,949 B2 | 7/2010 | Kister |
| 7,786,740 B2 | 8/2010 | Kister |
| 7,944,224 B2 | 5/2011 | Kister |
| 7,952,377 B2 | 5/2011 | Kister |
| 2001/0012739 A1 | 8/2001 | Grube et al. |
| 2001/0040460 A1 | 11/2001 | Beaman et al. |
| 2002/0070743 A1 | 6/2002 | Felici et al. |
| 2002/0125584 A1 | 9/2002 | Umehara et al. |
| 2002/0153913 A1 | 10/2002 | Okubo et al. |
| 2002/0190738 A1 | 12/2002 | Beaman et al. |
| 2002/0194730 A1 | 12/2002 | Shih et al. |
| 2004/0036493 A1 | 2/2004 | Miller |
| 2004/0119485 A1 | 6/2004 | Koch et al. |
| 2004/0239352 A1 | 12/2004 | Mizoguchi |
| 2005/0012513 A1 | 1/2005 | Cheng et al. |
| 2005/0184743 A1 | 8/2005 | Kimura |
| 2006/0033516 A1 | 2/2006 | Rincon et al. |
| 2006/0073712 A1 | 4/2006 | Suhir |
| 2006/0170440 A1 | 8/2006 | Sudin |
| 2006/0171425 A1 | 8/2006 | Lee et al. |
| 2007/0145989 A1 | 6/2007 | Zhu et al. |
| 2007/0167022 A1 | 7/2007 | Tsai et al. |
| 2007/0229103 A1 | 10/2007 | Tani |
| 2008/0074132 A1 | 3/2008 | Fan et al. |
| 2008/0088331 A1 | 4/2008 | Yoshida |
| 2008/0258746 A1 | 10/2008 | Tran et al. |
| 2009/0201041 A1 | 8/2009 | Kister |
| 2010/0109691 A1 | 5/2010 | Kister |
| 2010/0176832 A1 | 7/2010 | Kister |
| 2010/0182030 A1 | 7/2010 | Kister |
| 2010/0182031 A1 | 7/2010 | Kister |
| 2011/0006796 A1 | 1/2011 | Kister |
| 2011/0062978 A1 | 3/2011 | Kister |
| 2011/0273198 A1 | 11/2011 | Kister |
| 2011/0273199 A1 | 11/2011 | Kister |

FOREIGN PATENT DOCUMENTS

| | | |
|---|---|---|
| JP | 63307678 | 12/1988 |
| JP | 01128535 | 5/1989 |
| JP | 7-021968 | 1/1995 |
| JP | 7-333232 | 12/1995 |
| JP | 10506238 | 6/1998 |
| JP | 10221374 | 8/1998 |
| JP | 10311864 | 11/1998 |
| JP | 11044727 | 2/1999 |
| JP | 11241690 | 9/1999 |
| TW | 201109669 | 3/2011 |
| WO | WO 8704568 | 7/1987 |
| WO | WO-92/10010 | 6/1992 |
| WO | WO 96/15458 | 5/1996 |
| WO | WO-9743653 | 11/1997 |
| WO | WO00/54066 | 9/2000 |
| WO | WO01/09623 | 2/2001 |

OTHER PUBLICATIONS

Sporck, Nicholas, "A New Probe Card Technology Using Compliant Microsprings", *Proceedings 1997 IEEE International Test Conference* Nov. 1, 1997, 527-532.

\* cited by examiner

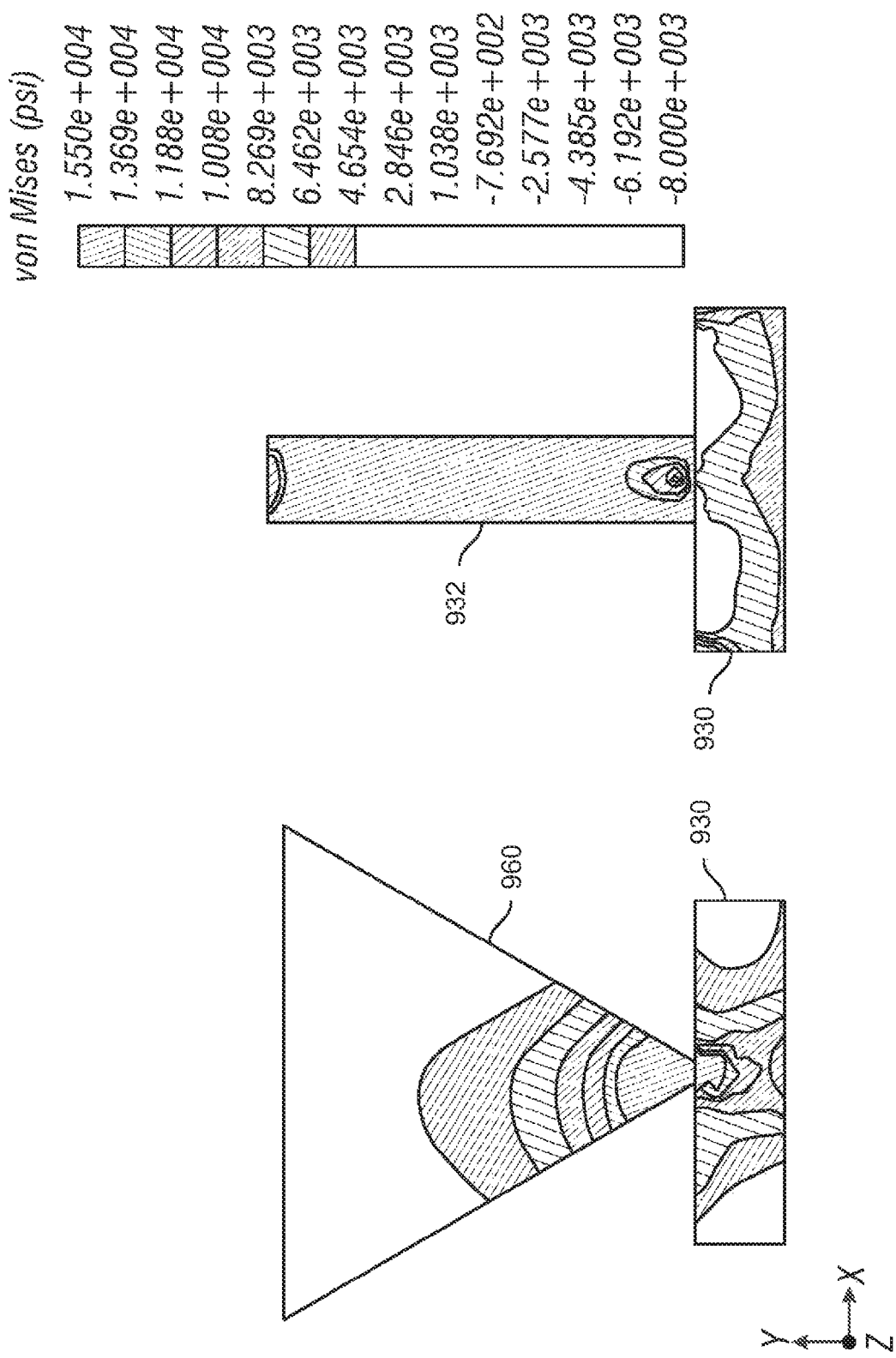

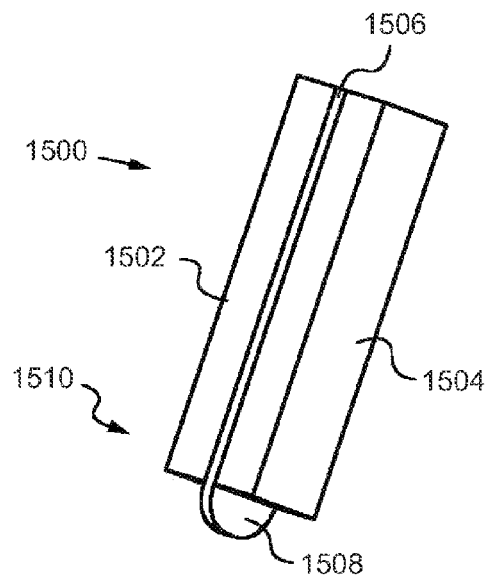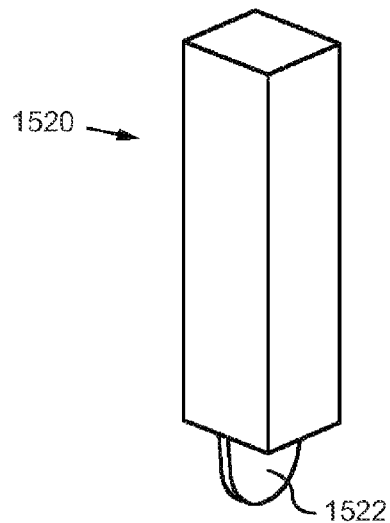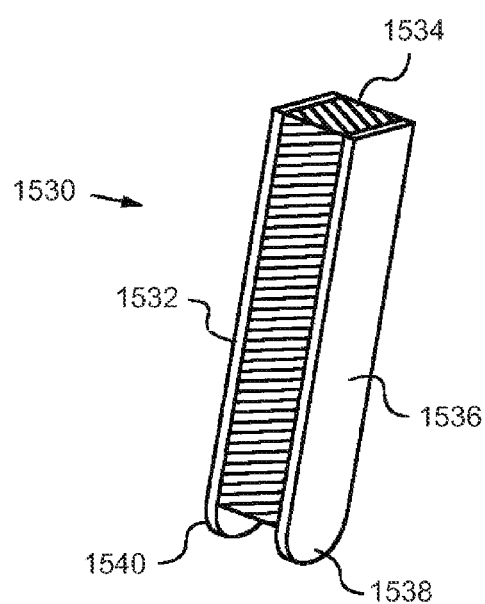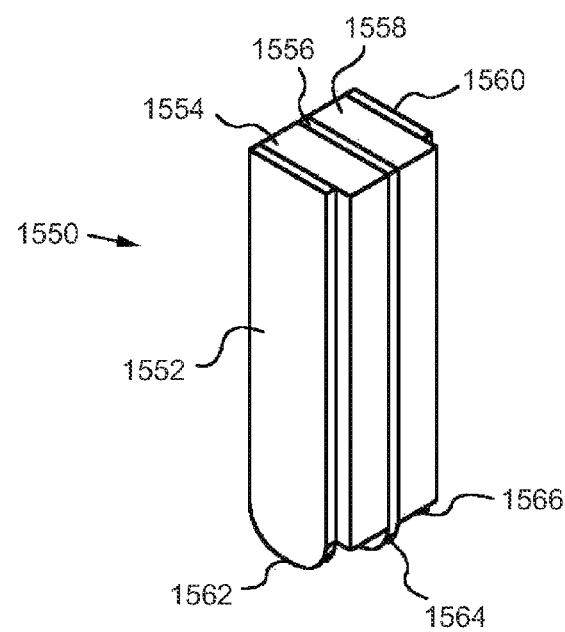

PROBES WITH OFFSET ARM AND SUSPENSION STRUCTURE

RELATED APPLICATIONS

This application is a continuation application of U.S. patent application Ser. No. 11/480,302, entitled "Probes with Self Cleaning Blunt Skates for Contacting Conductive Pads", to January Kister, filed on Jun. 29, 2006, which claims priority to and the benefit of U.S. patent application Ser. No. 10/888,347 (now U.S. Pat. No. 7,091,729), entitled "Cantilever Prove with Dual Plane Fixture and Probe Apparatus", to January Kister, filed on Jul. 9, 2004, and the specifications and claims thereof are incorporated herein by reference.

FIELD OF THE INVENTION

The present invention relates to cantilever probes. In particular, the present invention relates to a cantilever probe with angle fixture and a probe apparatus therewith. The present invention relates generally to probes for testing devices under test (DUTs), and in particular to probes with contacting tips terminated in blunt skates to promote self-cleaning on contact with contacting pads as well as self-cleaning methods.

BACKGROUND ART

Continuing miniaturization of cantilever probes imposes new challenges for their positioning and fixing within a probe apparatus. Cantilever probes are commonly fixed with their peripheral ends having their cantilever portion with the contacting tip freely suspended to provide the required flexibility. To provide sufficient positioning accuracy, the fixture portion of the cantilever probe is commonly extensively dimensioned, which in turn consumes extensive real estate forcing multilayer cantilever probe assemblies with varying cantilever geometries. Such varying cantilever geometries result in different deflection behavior and limited average positioning accuracy of all cantilever probes of a probe apparatus. In addition, cantilever probes of the prior art are commonly fixed in a surrounding fashion along a linear fixture element, which requires additional surrounding referencing and/or positioning structures, which in turn consume additional space between the cantilever probes.

Prior art cantilever probes are commonly fabricated with lengthy peripheral structures for a sufficient fanning out between the ever decreasing test contact pitches and circuit board contacts of the probe apparatus. Peripheral fan-out structures may be a multitude of the cantilever portion, which reduces the positioning accuracy of the ever decreasing cantilevers and contacting tips.

For the reasons stated above, there exists a need for a cantilever probe and probe assembly that provides maximum contacting tip accuracy together with homogeneous deflection behavior within a minimum footprint. In addition, cantilever probes may be simple and highly consistent in geometry for inexpensive mass production. Other affiliated structures of the probe apparatus may be inexpensively fabricated to accommodate for highly individualized probe apparatus configurations. Embodiments of the present invention address these needs.

The testing of semiconductor wafers and other types of integrated circuits (ICs), collectively known as devices under test (DUTs), needs to keep pace with technological advances. Each IC has to be individually tested, typically before dicing, in order to ensure that it is functioning properly. The demand for testing products is driven by two considerations: new chip designs and higher volumes. As chips become increasingly powerful and complicated, the need for high-speed probe card devices to test them becomes more and more deeply felt.

In particular, chips are getting smaller and they have more tightly spaced conductive pads. The pads are no longer located about the circuit perimeter, but in some designs may be found within the area occupied by the circuit itself. As a result, the density of leads carrying test signals to the pads is increasing. The pads themselves are getting thinner and more susceptible to damage during a test. Meanwhile, the need to establish reliable electrical contact with each of the pads remains.

A well-known prior art solution to establishing reliable electrical contact between a probe and a pad of a DUT involves the use of probes that execute a scrub motion on the pad. The scrub motion removes the accumulated oxide layer and any dirt or debris that acts as an insulator and thus reduces contact resistance between the probe and the pad. For information about corresponding probe designs and scrub motion mechanics the reader is referred to U.S. Pat. No. 5,436,571 to Karasawa; U.S. Pat. Nos. 5,773,987 and 6,433,571 both to Montoya; U.S. Pat. No. 5,932,323 to Throssel and U.S. Appl. 2006/0082380 to Tanioka et al. Additional information about the probe-oxide-semiconductor interface is found in U.S. Pat. No. 5,767,691 to Verkuil.

In order to better control the scrub motion, it is possible to vary the geometry of the contacting tip of the probe. For example, the radius of curvature of the tip may be adjusted. In fact, several different radii of curvature can be used at different positions along the probe tip. For additional information about probe tips with variable radii of curvature the reader is referred to U.S. Pat. No. 6,633,176 and U.S. Appl. 2005/0189955 both to Takemoto et al.

Although the above-discussed prior art apparatus and methods provide a number of solutions, their applications when testing conductive pads that are thin or prone to mechanical damage due to, e.g., their thickness or softness is limited. For example, the above probes and scrub methods are not effective when testing DUTs with low-K conductive pads made of aluminum because such pads are especially prone to damage by probes with tips that either cut through the aluminum or introduce localized stress that causes fractures. In fact, a prior art solution presented in U.S. Pat. No. 6,842,023 to Yoshida et al. employs contact probe whose tip tapers to a sloping blade or chisel. The use of this type of probe causes a knife edge and/or single point of contact effects to take place at the tip-pad interface. These effects can causes irreversible damage to pads, especially low-K conductive pads made of aluminum or soft metal. On the other hand, when insufficient contact force is applied between the probe tip and the pad, then the oxide and any debris at the probe-pad interface will not be efficiently removed.

The problem of establishing reliable electrical contact with fragile conductive pads remains. It would be an advance in the art to provide are probes that can execute effective scrubbing motion and are self-cleaning, while at the same time they do not cause high stress concentration in the pad. Such probes need to be adapted to probe cards for testing densely spaced pads.

OBJECTS AND ADVANTAGES

In view of the above prior art limitations, it is an object of the invention to provide probes that are self-cleaning upon contact and avoid long-term accumulation of debris to thus preserve their ability to establish good electrical contact or low contact resistance $R_c$.

It is a further object of the invention to provide probes that reduce mechanical stress concentration in the pads of the DUT being tested to render the probes suitable for testing low-K conductive pads.

A still further object of the invention is to provide probes and self-cleaning methods that can be applied in various probe geometries, probe cards and test arrangements.

These and other objects and advantages of the invention will become apparent from the ensuing description.

SUMMARY OF THE INVENTION

A cantilever probe has an elbow for bonding to a dual plane fixture plate having two substantially non parallel fixture surfaces in an angle corresponding to the elbow. The dual plane angled fixture between elbow and fixture plate provides for a highly stiff and precise hold of the bonded cantilever probe with minimal real estate consumption. The cantilever probe may feature at least two positioning pins one of which may be placed at the contacting tip and the other one may extend from at least one of two contacting faces of the elbow. The elbow positioning pin may fit into a corresponding elbow pin hole on one of the fixture surfaces. The tip positioning pin may fit into a corresponding tip pin hole of a sacrificial assembly plate temporarily combined with the fixture plate for a precise positioning of the cantilever probes during curing, setting or hardening of a bonding agent between the fixture plate an the elbow. After assembly of a number of cantilever probes, the sacrificial plate may be removed and the tip pins eventually sanded to a common plane.

Separate fan-out beams may be aligned with beam positioning pins on and attached to the fixture plate. The fan-out beams are aligned and conductively connected with their probe connect ends to respective probe elbows once the cantilever probes are fixed. The fan-out beams in turn may be conductively connected with their respective peripheral connect ends to well known large pitch apparatus terminals of a circuit board. Cantilever probes and fan-out beams may have geometries suitable for inexpensive mass fabrication by well known masked electro deposition fabrication techniques. A probe apparatus may be easily customized by providing varying drill patterns of the positioning holes for fan-out beams and cantilever probes to match pitch requirements of the tested circuit chips.

The objects and advantages of the invention are secured by a probe designed for engaging a conductive pad of a device under test (DUT). The probe has an electrically conductive body that ends in a contacting tip of a certain tip width. At least one blunt skate that is narrower than the tip width terminates the contacting tip. The blunt skate is aligned along a scrub direction and also has a certain curvature along the scrub direction to produce a self-cleaning rotation or rocking motion. As a result of the alignment and skate geometry, once a contact force is applied between the blunt skate and the conductive pad the skate undergoes a scrub motion along the scrub direction and also a self-cleaning rotation. While the scrub motion clears oxide from the pad to establish electrical contact, the rotation removes debris from the skate and thus preserves low contact resistance between the skate and the pad.

To promote the self-cleaning rotation the curvature of the blunt skate needs to have an appropriate radius of curvature. Preferably, the radius of curvature is variable and decreasing towards the front of the skate. Since the skate is preferably symmetric about a midpoint, the same variable radius of curvature can be used in the back half of the skate. In one embodiment the cross-section of the blunt skate is flat and in another it has a rounded cross-section. In general, it is preferable that the skate have a width of less than 12 μm and a length of less than 75 μm. It should be noted that probes with blunt skates in this dimensional range are very well-suited for contacting DUTs with low-K conductive pads that are mechanically fragile.

In some embodiments the probe is made of material layers. Such layers can be grown, e.g., in a deposition process. In these embodiments the blunt skate can be formed from an extension of one of the material layers. The most appropriate material layer for forming a blunt skate from its extension is a hard conductive material such as rhodium or cobalt. In either the layered probe embodiments or still other embodiments it is possible to provide two or more blunt skates. The skates can be arranged parallel to each other. Alternatively, or in addition the skates can be staggered along the scrub direction.

The invention further extends to a method for engaging probes that have conductive bodies and contacting tips terminating in one or more blunt skates with a conductive pad. The skate or skates are narrower than the tip width. The skate or skates are provided with a curvature aligned along the scrub direction for producing the self-cleaning rotation. The application of a contact force between the skate and the conductive pad causes the skate to undergo a scrub motion along the scrub direction and a self-cleaning rotation that removes debris. The debris is usually accumulated during previous engagements with or touch-downs on pads and its removal from the skate preserves low contact resistance.

In accordance with a preferred embodiment of the method, the contact force is augmented to increase the self-cleaning rotation. This can be done whenever excess debris accumulates. Typically this will take place after several cycles, and thus the contact force can be augmented after two or more touch-down cycles to augment the self-cleaning rotation.

To perform a test, a test current i is applied to the probe after applying the contact force. This means that the skate delivers the test current i to the pad after performing the scrub motion that removes any oxide from the pad and establishing electrical contact with it. Note that no current is applied when performing increased self-cleaning rotation of the skate. The same method is applied when two or more parallel and/or staggered skates are used.

The probes of invention can be used in various apparatus and situations. For example, the probes can be used in a probe card for testing devices under test (DUTs) such as semiconductor wafers. The probe card requires appropriate design and devices, such as a source for delivering the test current i as well as arrangements for providing the overdrive to apply the contact force between the probes and the pads of the DUT.

A detailed description of the preferred embodiments of the invention is presented below in reference to the appended drawing figures.

BRIEF DESCRIPTION OF THE DRAWING FIGURES

FIG. 11A-D are three-dimensional views of the successive steps in engaging a blunt skate with a low-K conductive pad.

Figure 12:
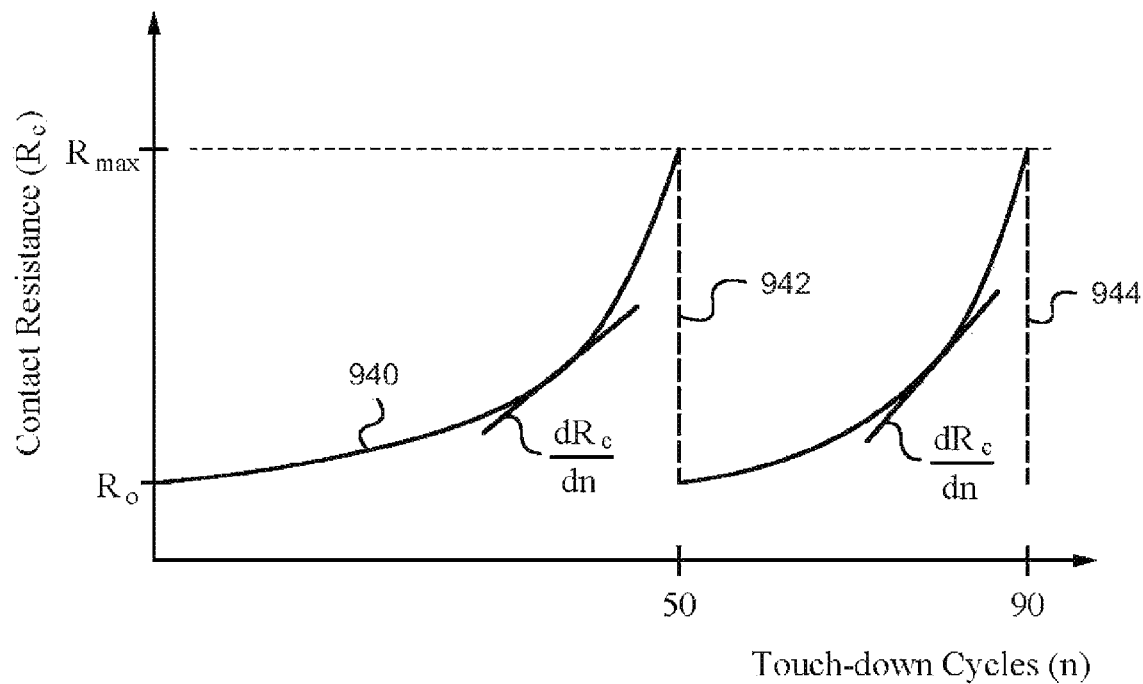

FIG. 12 (prior art) is a graph of contact resistance $R_c$ between a typical flat contacting tip and a conductive pad as a function of touch-down cycles.

Figure 13:
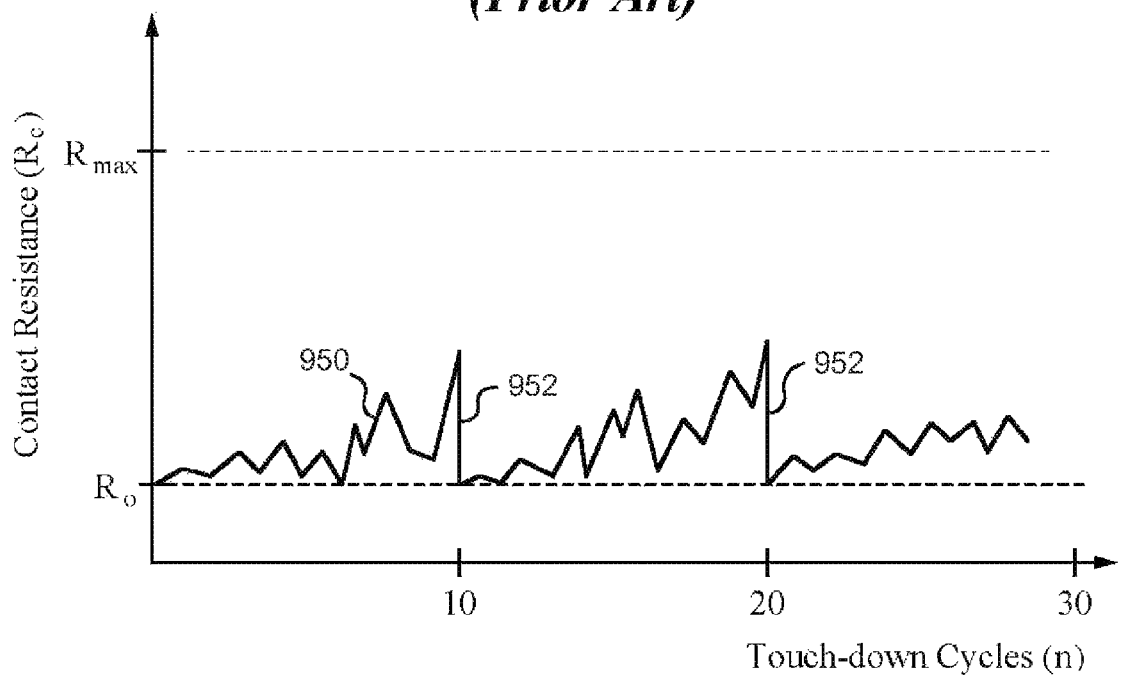

FIG. 13 is a graph of contact resistance $R_c$ between a contacting tip equipped with a blunt skate in accordance with the invention and a conductive pad.

FIG. 14 is a diagram comparing the performance of a prior art chisel tip and a tip with a blunt skate in accordance with the invention.

FIG. 15A-D are three-dimensional views of alternative probe tips with one or more blunt skates according to the invention.

Figure 16A:
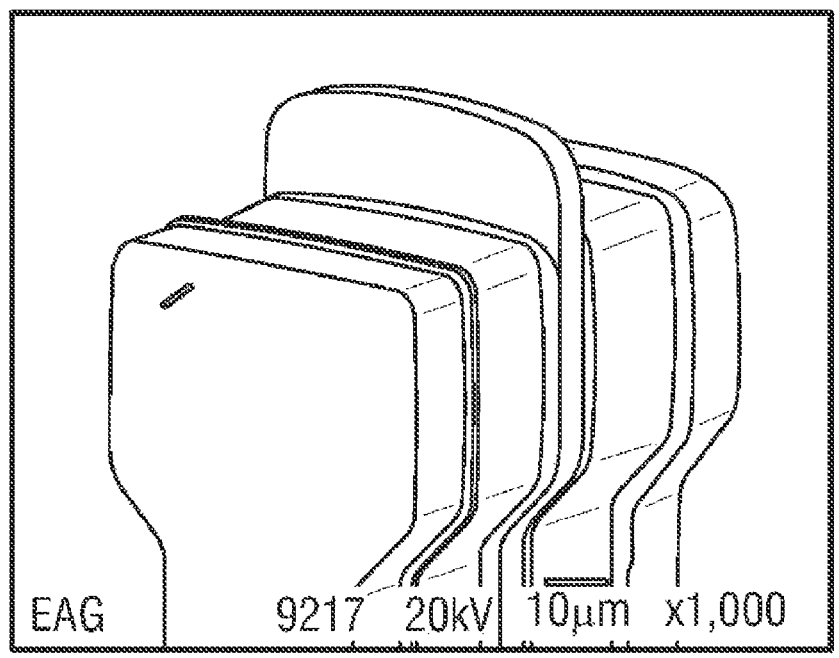
Figure 16B:
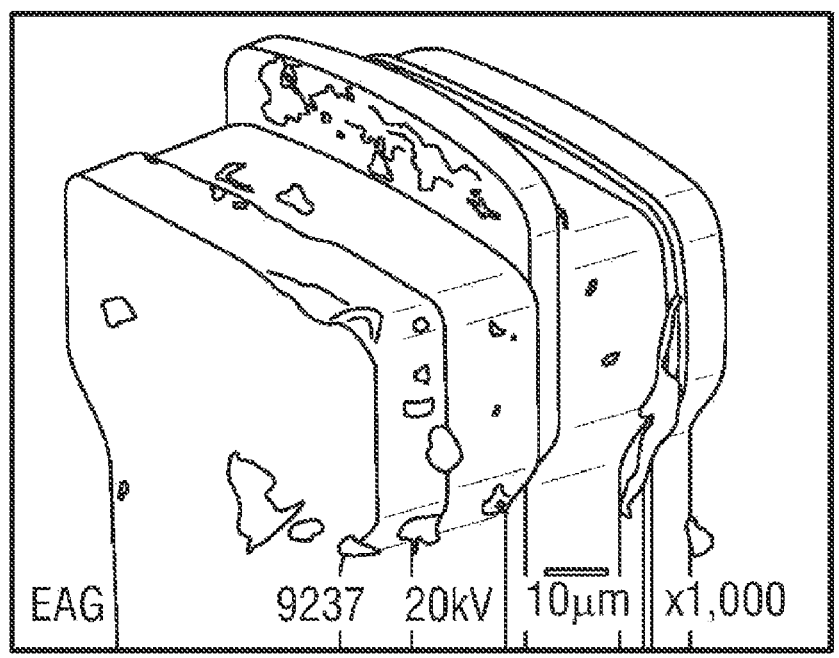

FIG. 16A-B are microscope images of a preferred blunt skate prior to use and after one million touch-down cycles.

DETAILED DESCRIPTION

Figure 1A:
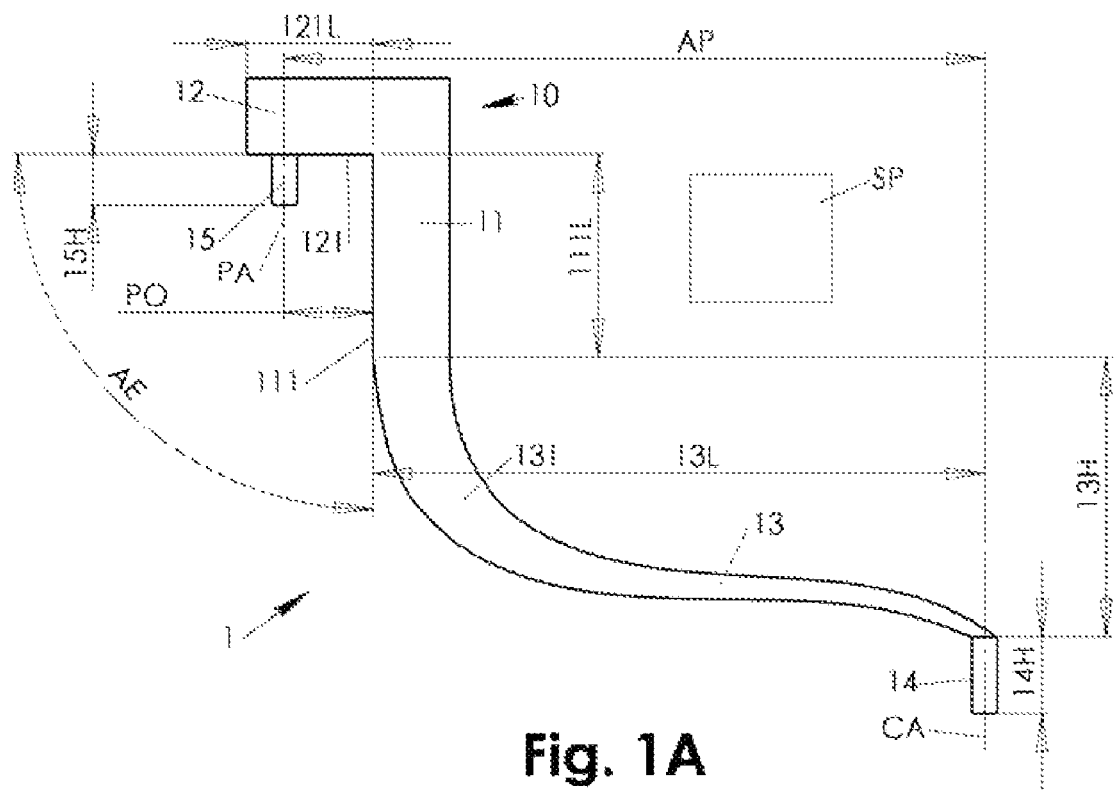
FIG. 1A is a front view of an exemplary cantilever probe of the preferred embodiment parallel a symmetry plane of the cantilever probe.
Figure 1B:
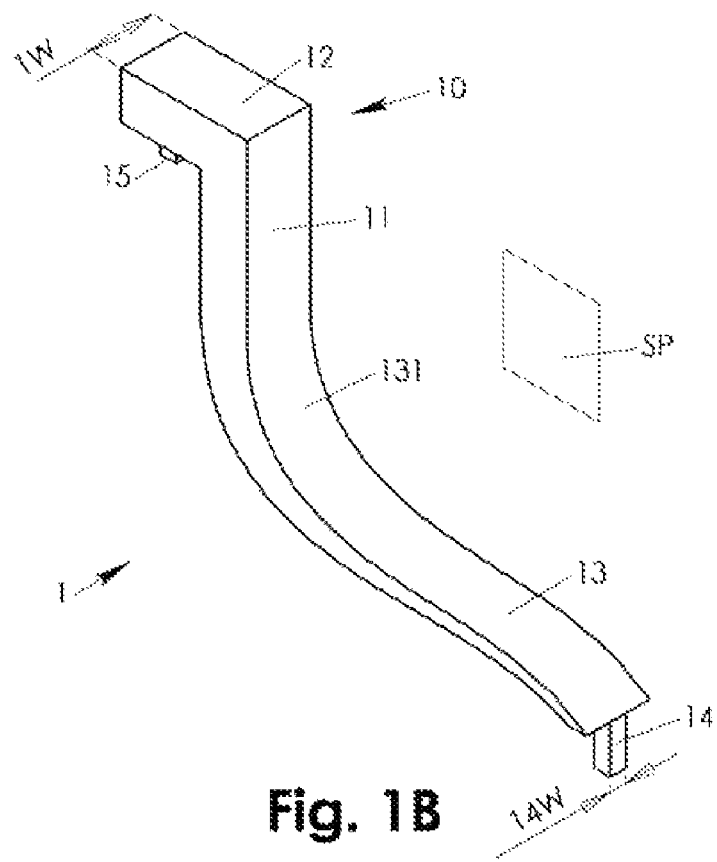
FIG. 1B is a perspective view of the cantilever probe of FIG. 1A.

Referring to FIGS. 1A, 1B, a cantilever probe 1 for test contacting a well known test contact of a tested electronic circuitry along a contacting axis CA may have a tip positioning pin 14 configured for the test contacting. The tip positioning pin 14 may also be configured for an aligning insertion in a respective one of tip pin holes 43A-43N (see FIG. 3) also along the contacting axis CA. The cantilever probe 1 may further feature a cantilever 13 for resiliently holding the tip positioning pin 14 with respect to the contacting axis CA with a predetermined deflection behavior including a well known scrub motion along the symmetry plane SP.

A base arm 11 may rigidly extend from said cantilever probe 13 such that operational deflection of the cantilever 13 leaves a base arm assembly face 111 substantially free of deformation. An offset arm 12 extends substantially rigid from the base arm 11 in a substantially non parallel elbow angle AE defining together with the base arm 11 a fixture elbow 10 for rigidly fixing the cantilever probe 1 preferably via base arm assembly face 111 and offset arm assembly face 122. An elbow positioning pin 15 extends from one of the base arm 11 and the offset arm 12 along an elbow pin axis PA, which is substantially parallel to the contacting axis CA. The elbow positioning pin 15 is configured for an aligning insertion in a respective one of elbow pin holes 23A-23N (see FIGS. 2, 6) together with aligning insertion of the tip positioning pin 14. The base arm assembly face 111 has a length 111L and the offset arm assembly face 121 has length 121L. The contacting axis CA is in a probe pin distance AP to the elbow pin axis PA.

The cantilever 13 may preferably have a bend 131 terminating at the base arm 11, which in turn may preferably extend substantially parallel to the contacting axis CA. In that case, the elbow positioning pin 14 may extend from the offset arm 12.

The cantilever 13, the base arm 11 and the offset arm 12 may have a continuously protruding profile perpendicular with respect to the symmetry plane SP and the contacting axis CA. In such case, the cantilever probe 1 may be fabricated by a masked electro deposition process in which a central layer including the position pins 14, 15 is interposed between profile layers. As a result, the positioning tips 14, 15 may have at least rectangular but preferably square cross section. The cantilever probe 1 may consequently be also substantially symmetric with respect to the symmetry plane SP that coincides with the contacting axis CA and the elbow pin axis PA.

Deflection behavior of the cantilever 13 may be tuned by adjusting the cantilever length 13L, cantilever height 13H, profile width 1W as well as shape and material composition of the cantilever 13 as may be well appreciated by anyone skilled in the art. Furthermore, instead of the cantilever 13 another suspension structure may be employed such as a suspension knee disclosed in the cross referenced US application, titled "Freely Deflecting Knee Probe With Controlled Scrub Motion". Thereby, the tip positioning pin may be combined with the suspension knee at the contacting face.

Figure 2:
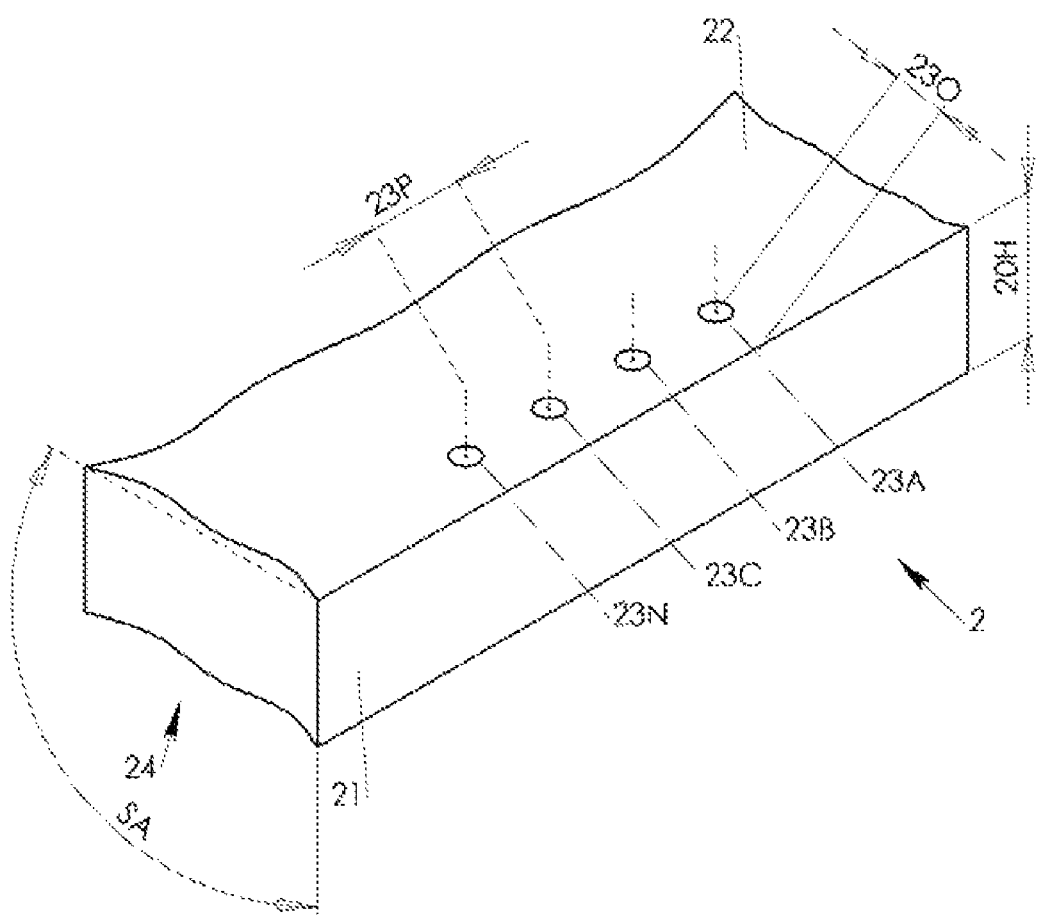
FIG. 2 is the perspective view of a first portion of a fixture plate including two fixture surfaces and elbow alignment holes.

Referring to FIG. 2, a probe fixture plate 2 for fixedly holding a number of cantilever probes 1 may have a first fixture surface 22 featuring a number of primary positioning holes 23A-23N for the aligned insertion of a number of elbow positioning pins 15. The probe fixture plate 2 may additionally feature a second fixture surface 21 in a substantially non parallel fixture surface angle SA to said first fixture surface 22. The fixture surface angle SA corresponds to the elbow angle AE. The second fixture surface 22 preferably extends in substantially constant offset 23O to an array direction of the positioning holes 23A-23N arrayed with positioning hole pitch 23P.

In case the primary elbow positioning holes 23A-23N are linearly arrayed, the second fixture surface 21 may be planar. The fixture surface angle SA may be perpendicular.

Figure 3:
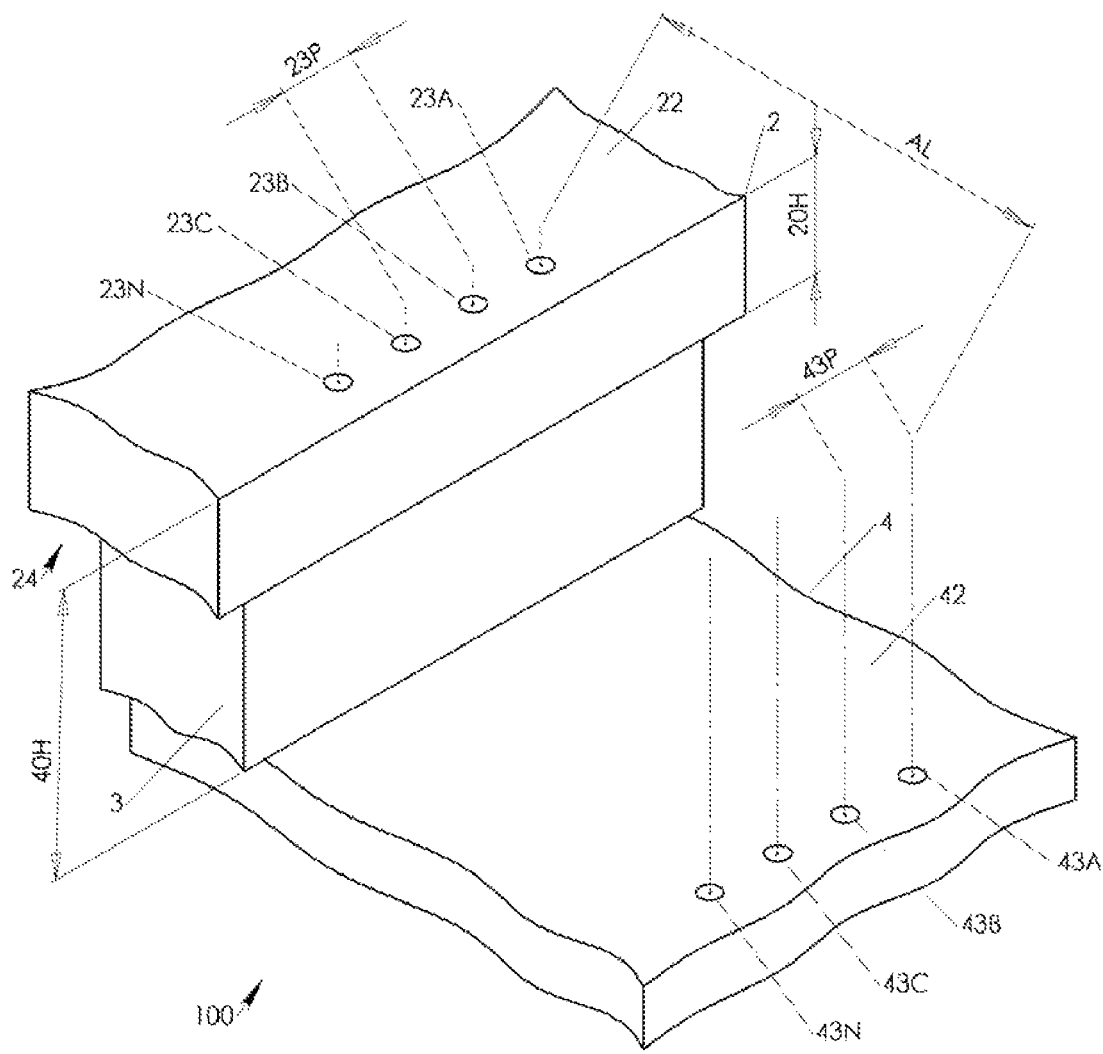
FIG. 3 is the perspective view of the fixture plate of FIG. 2 together with a sacrificial spacing structure and sacrificial assembly plate.

Referring to FIG. 3, a temporary plate assembly 100 may include a sacrificial assembly plate 4 separable attached to an attachment face 24 of the probe fixture plate 2. The sacrificial assembly plate 4 has a third surface 42 with secondary tip positioning holes 43A-43N in a probe positioning hole offset AL that corresponds to the probe pin distance AP. A secondary hole pitch 43P may be preferably equal or less than the primary hole pitch 23P. The attachment face 24 may be opposite the first fixture surface 22.

The third surface 42 may be in a surface offset 40H to the first fixture surface 22 in direction of the primary holes 23A-23N and secondary holes 43A-43N. In the case where the surface offset 40H is substantially larger than a fixture plate height 20H, a sacrificial spacing structure 3 may be interposed between the probe fixture plate 2 and the sacrificial assembly plate 2. Sacrificial assembly plate 4 and sacrificial spacing structure 3 may be separable by use of a selectively dissolvable solder or other bonding agent as may be well appreciated by anyone skilled in the art.

Figure 4:
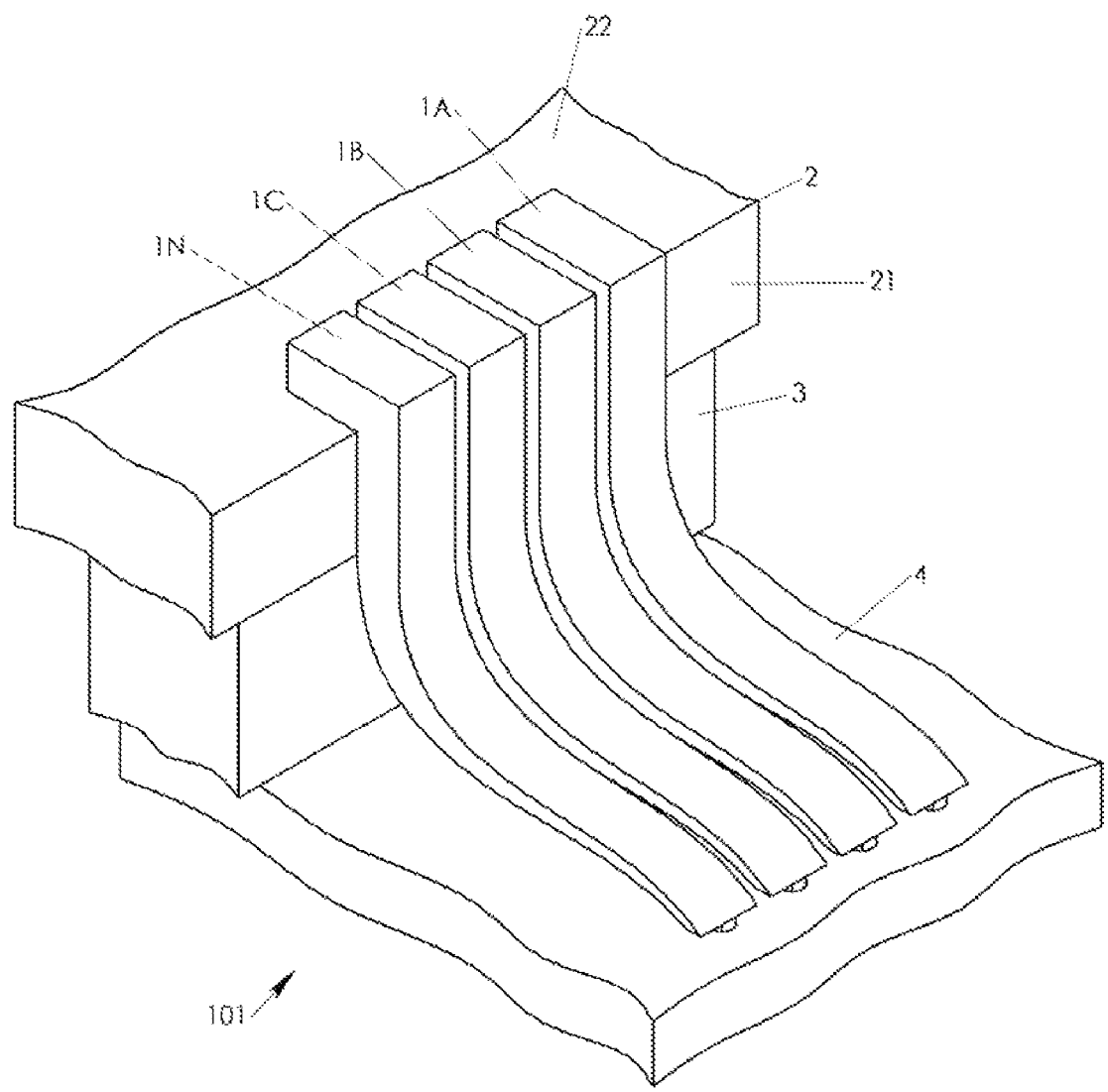
FIG. 4 is the perspective view of the plates of FIG. 3 with a number of assembled cantilever probes of FIGS. 1A, 1B.

Referring to FIG. 4, a probe bonding assembly 101 may include the temporary plate assembly 100 and a number of cantilever probes 1A-1N aligned inserted with their elbow positioning pins 15 in a respective one of the elbow positioning holes 23A-23N and their tip positioning pins 14 concurrently aligned inserted in a respective one of the tip positioning holes 43A-43N. As a result, the base arm assembly face 111 may be brought into a combining proximity with the second fixture surface 21 and the offset arm assembly face 121 may be brought into a combining proximity with the first fixture surface 22. For that purpose, the elbow pin axis PA may be in an assembly face offset PO to the adjacent assembly face that is equal or slightly larger the constant offset 23O between the center of the elbow positioning holes 23A-23N and the second fixture surface 21. In case of the cantilever probe 1 the assembly face offset PO is between offset arm assembly face 121 and the elbow positioning pin 15.

A robotic probe assembling may be accomplished in combination with a vacuum fixture holding a cantilever probe 1 and moving it towards assembly position in direction along the contacting axis CA and elbow pin axis PA. In cases where the scale of the positioning pins 14, 15 is close to the positioning accuracy of the robotic assembly system, a sequential aligned insertion may be accomplished by varying the elbow pin height 15H from the tip pin height 14H. Once a first aligned insertion is accomplished, the second aligned insertion may be attempted without risk of again misaligning the other of the positioning pins 14, 15.

Figure 5:
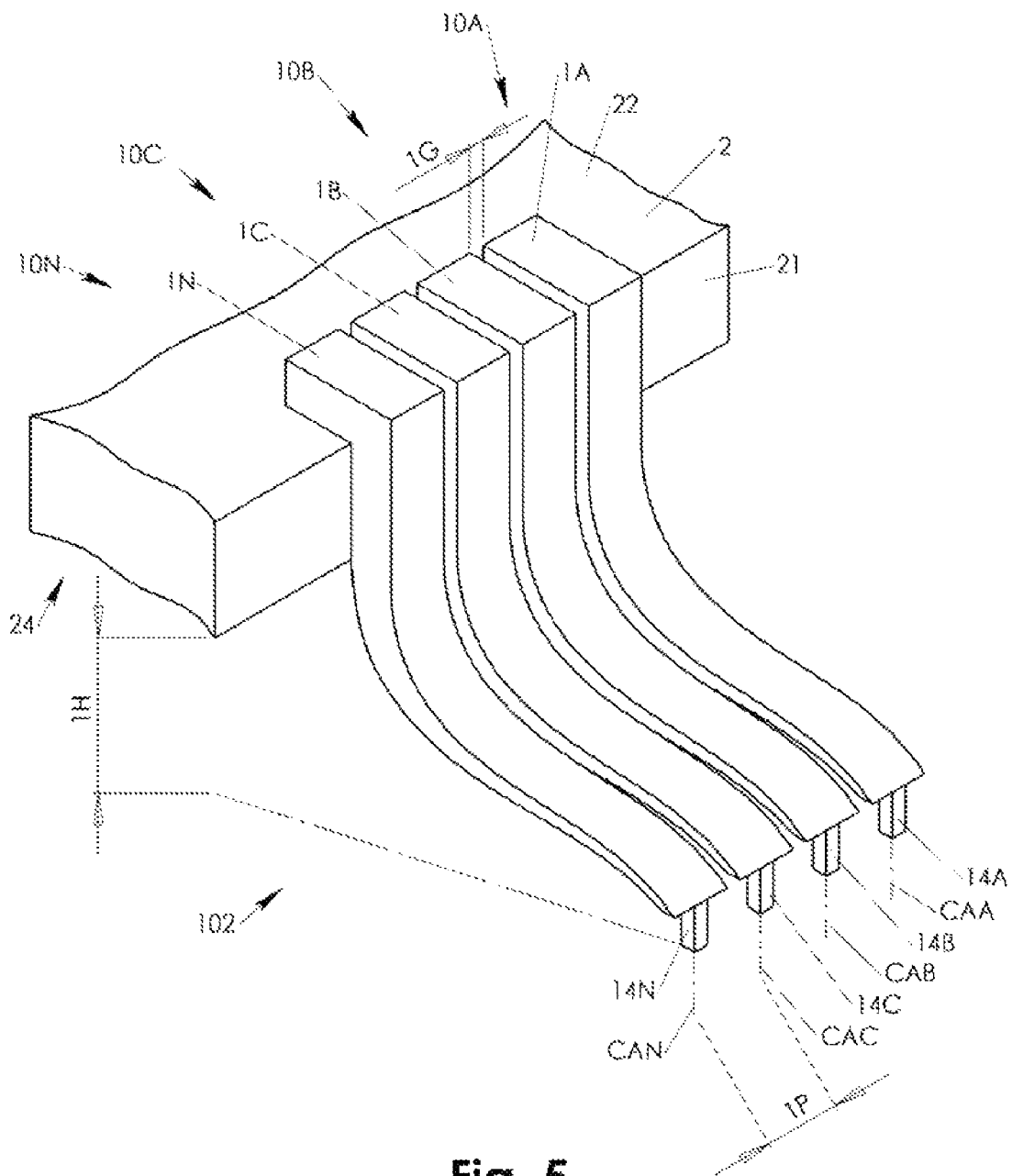
FIG. 5 is the perspective view of assembled probes and fixture plate of FIG. 4 with removed sacrificial spacing structure and sacrificial assembly plate.

Referring to FIG. 5, a fixed probe assembly 102 features a number of cantilever probes 1A-1N fixed with their respective fixture elbows 10A-10N to the fixture plate 2 preferably by applying a combining or bonding agent in the combining proximity between the assembly faces 111, 121 and their respective fixture surfaces 21, 22. A combining or bonding agent may be for example an epoxy or a solder. In case a solder is used, an electrically conductive connection may be simultaneously established between the fixture elbows 10A-10N and eventual conductive traces on one or both of the fixture surfaces 21, 22. Sacrificial assembly plate 4 and eventual sacrificial spacing structure 3 are removed. The tip positioning pins 14A-14N are configured to operate additionally for test contacting along their respective contacting axis CAA-CAN with an eventual scrub motion. For that purpose, the tip positioning pins 14A-14N may be adjusted to a common tip clearance 1H by a sanding operation.

The contacting axes CAA-CAN are in a contacting pitch 1P that corresponds to the secondary hole pitch 43P. In case of linear arrayed elbow positioning holes 23A-23N and planar second fixture surface 21, the cantilever probes 1 may be parallel assembled with constant gap 1G and constant profile width 1W.

The elbow positioning holes 23A-23N may also be arrayed with curvature and the second fixture surface 21 may be concentric as well as the secondary positioning holes 43A-43N being concentrically arrayed with proportionally reduced secondary hole pitch 43P. In that case, the cantilever probes 1 may be arrayed with minimal contacting pitch 1. Furthermore, the probes 1 may have a proportionally decreasing profile width 1 resulting again in a constant probe spacing 1G. Another advantage may be a favorably balanced stress distribution as a result of the profile width 1 increasing proportionally with the distance from the contacting axes CAA-CAN, which corresponds to the bending stress increasing in the cantilever 13 away from the contacting axes CAA-CAN as may be well appreciated by anyone skilled in the art.

The angled fixture is particularly advantageous in minimizing an overall real estate of the fixed probe assembly in perpendicular extension to the contacting axes CAA-CAN. This results on one hand from utilizing the second fixture surface 21 preferably parallel to the contacting axes CAA-CAN, which consumes only a minimal real estate independently of the fixture plate height 20H. The minimized overall real estate results on the other hand from an increased stiffness and thermal stability of the angled fixture due to the three dimensional configuration of the bonding interface between fixture surfaces 22, 21 and the assembly faces 121, 111 together with a reduced combining proximity and minimal use of combining agent. Further more, the bonding interface is free of lateral structures in between adjacent cantilever probes 1, resulting in a maximum profile width 1, which in turn assists in designing suspension structures highly resistant against inadvertent deviating torsion bending.

Figure 6:
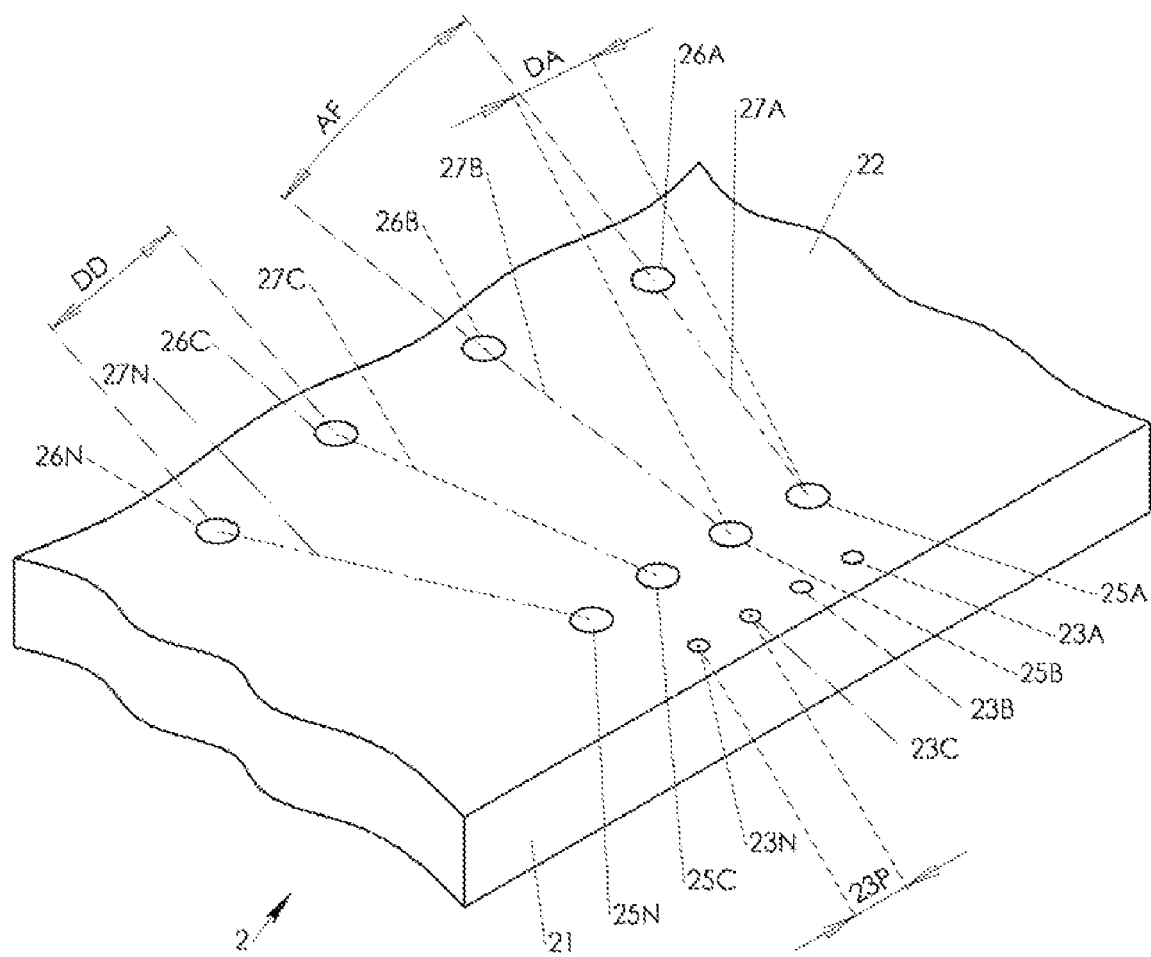
FIG. 6 is the perspective view of a second portion of a fixture plate including the first portion of FIG. 2 and alignment holes for fan-out beams.

Referring to FIG. 6, the first fixture surface 22 may further feature alignment holes 25A-25N and orienting holes 26A-26N. Each of the alignment holes 25A-25N defines with a respective one of the orienting holes 26A-26N one of the positioning axes 27A-27N. The positioning axes 27A-27N may be oriented in a fan-out angle AF with respect to an adjacent one of the positioning axes 27A-27N. Consequently, an alignment hole distance DA between adjacent ones of the alignment holes 25A-25N is substantially smaller than an orienting hole distance DO between adjacent ones of the orienting holes 26A-26N. The alignment hole distance DA is about the same as the positioning hole pitch 23P. The distance of the positioning axes 27A-27N corresponds to a beam pin distance 57 (see FIG. 7).

Particular advantageous is a fabrication step of concurrently drilling all holes 23A-23N, 43A-43N, 25A-25N and 26A-26N without need of intermediate repositioning of the temporary plate assembly 100, which provides for highest hole position accuracies with minimal machining effort. In that way highly individualized probe assemblies may be fabricated in combination with standardized cantilever probes 1 and fan-out beams 5 (see FIG. 7).

Figure 7:
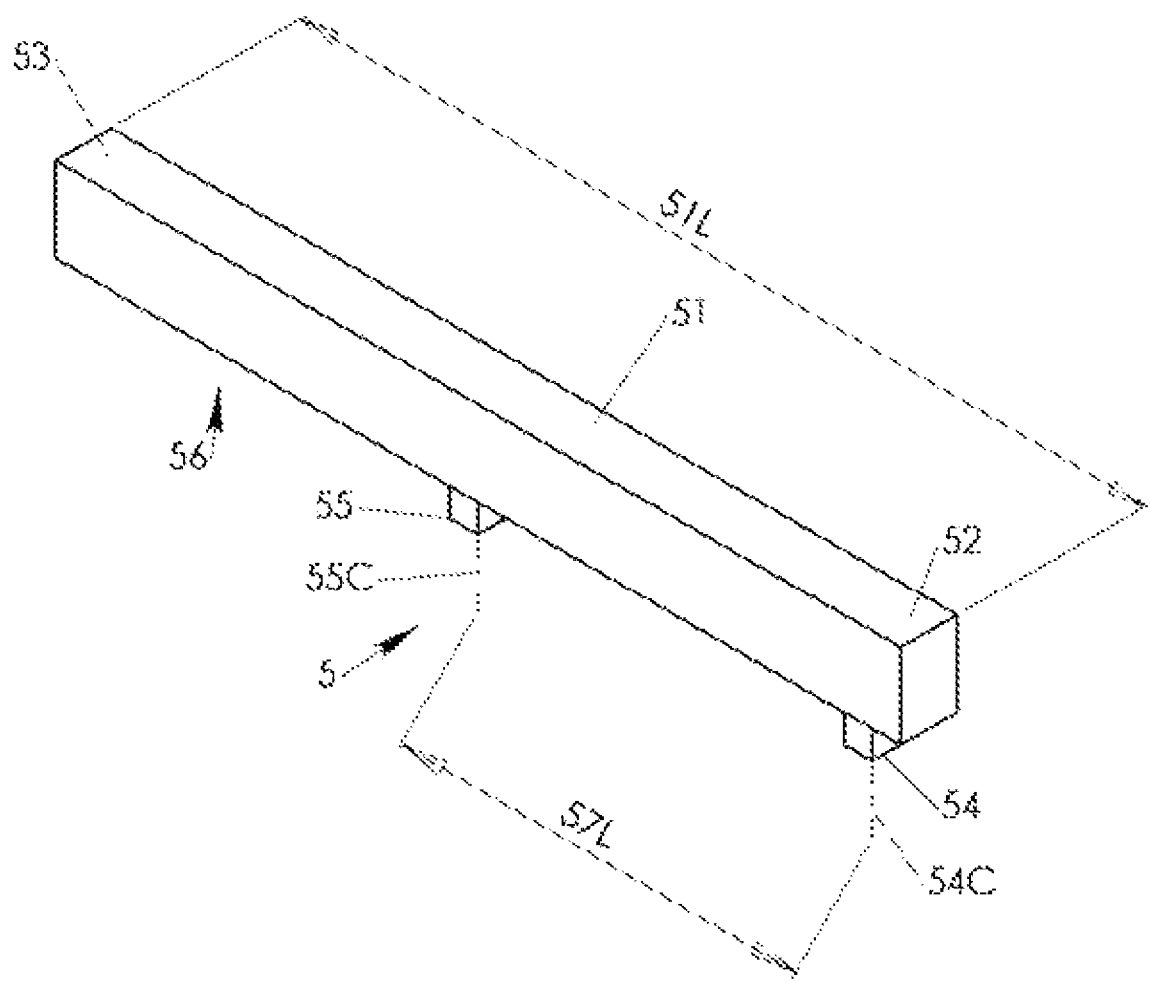
FIG. 7 is the perspective view of an exemplary fan-out beam.

Referring to FIG. 7, a fan-out beam 5 may be fabricated from electrically conductive material with a beam length 51L. The fan-out beam 5 may have a probe connect end 52 and a peripheral connect end 53 on a connect surface 51. Opposite the connect surface 51 may be a beam attachment face 56 featuring an elbow alignment pin in the proximity of the probe connect end 52. A fan-out orienting pin 55 may be with its orienting pin axis 55C in a beam pin distance 57 to alignment pin axis 54C. The fan-out beam 5 may be fabricated similarly like the cantilever probe 1 with a masked electro deposition process in a multi layer fashion.

Figure 8:
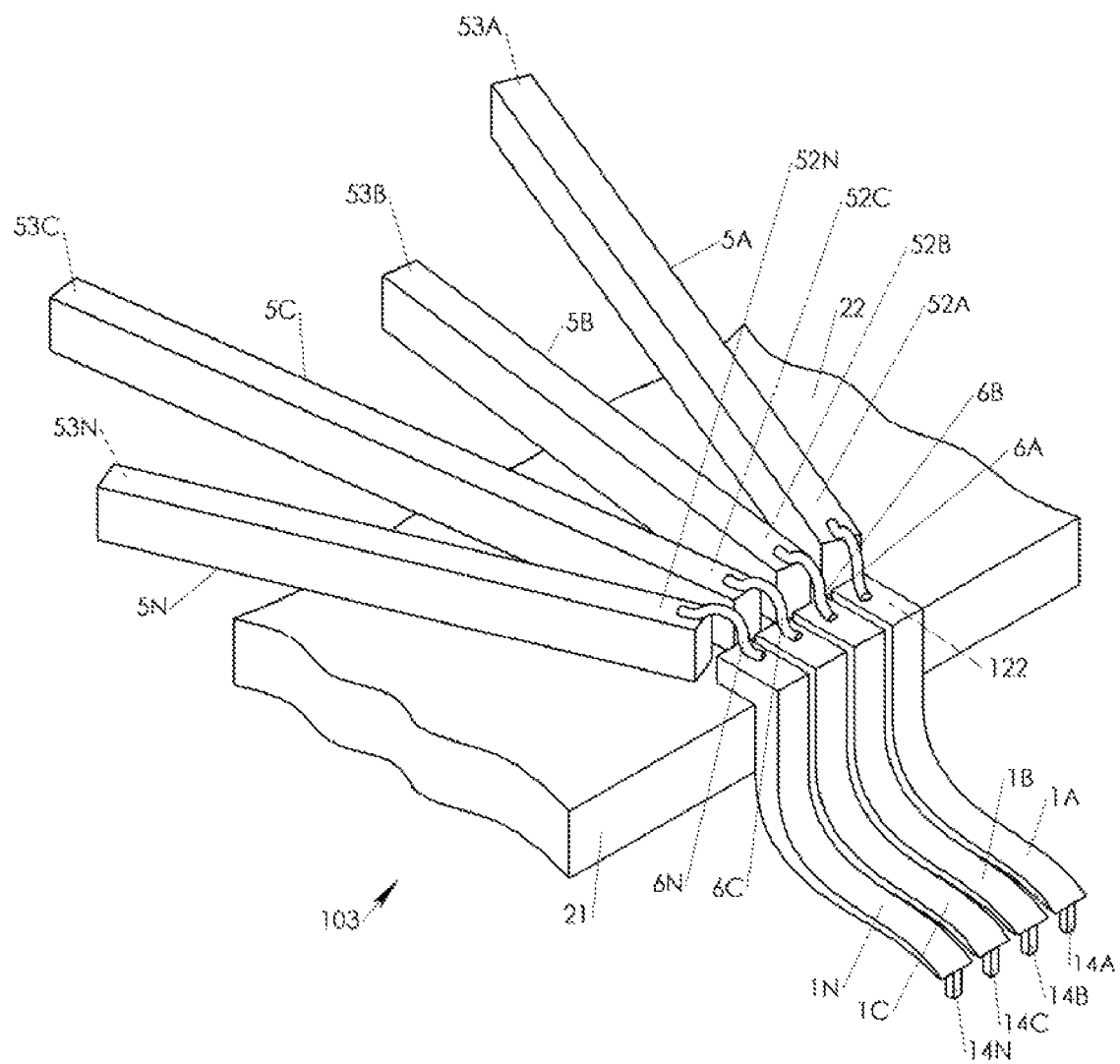
FIG. 8 is the perspective view of the assembled cantilever probes and fixture plate of FIG. 5, the fixture plate of FIG. 6 and a number of assembled fan-out beams of FIG. 7 conductively connected with respective cantilever probes.

Referring to FIG. 8, a probe and fan-out beam assembly 103 features a fixed probe assembly 102 with the fixture plate 2 of FIG. 6 with respect to which a number of fan-out beams 5A-5C are positioned via their elbow alignment pins 54 in respective ones of the alignment pin holes 25A-25N and oriented with their orienting pins 55 in respective ones of the orienting pin holes 26A-26N such that their probe connect ends 52A-52N are in close proximity to respective ones of elbow fixtures 10A-10N. The fan-out beams 5 may be bonded or combined with its attachment face 56 with the first fixture surface 22.

Conductive bridges 6A-6N electrically conductive connect fixture elbows 10A-10N with respective ones of the probe connect ends 52A-52N such that a solid conductive path is established between the tip positioning pins 14A-14N and respective ones of the peripheral connect ends 53A-53N. The conductive bridges 6A-6N may be fabricated by well known wire bonding and/or wedge bonding techniques.

The fan-out beams 5 may be alternately lengthened for a zigzag connect end pattern for increased spacing between adjacent ones of the peripheral connect ends 53A-53N, which may be conductively connected to well known assembly contacts of a probe apparatus.

Fixed probe assembly 102 and/or probe and fan-out beam assembly 103 may be part of a probe apparatus for testing electronic circuitry. Fan-out beams 5 and probes 1 may be economically fabricated in large number in a common configuration and combined with individually fabricated fixture plates 2.

Figure 9:
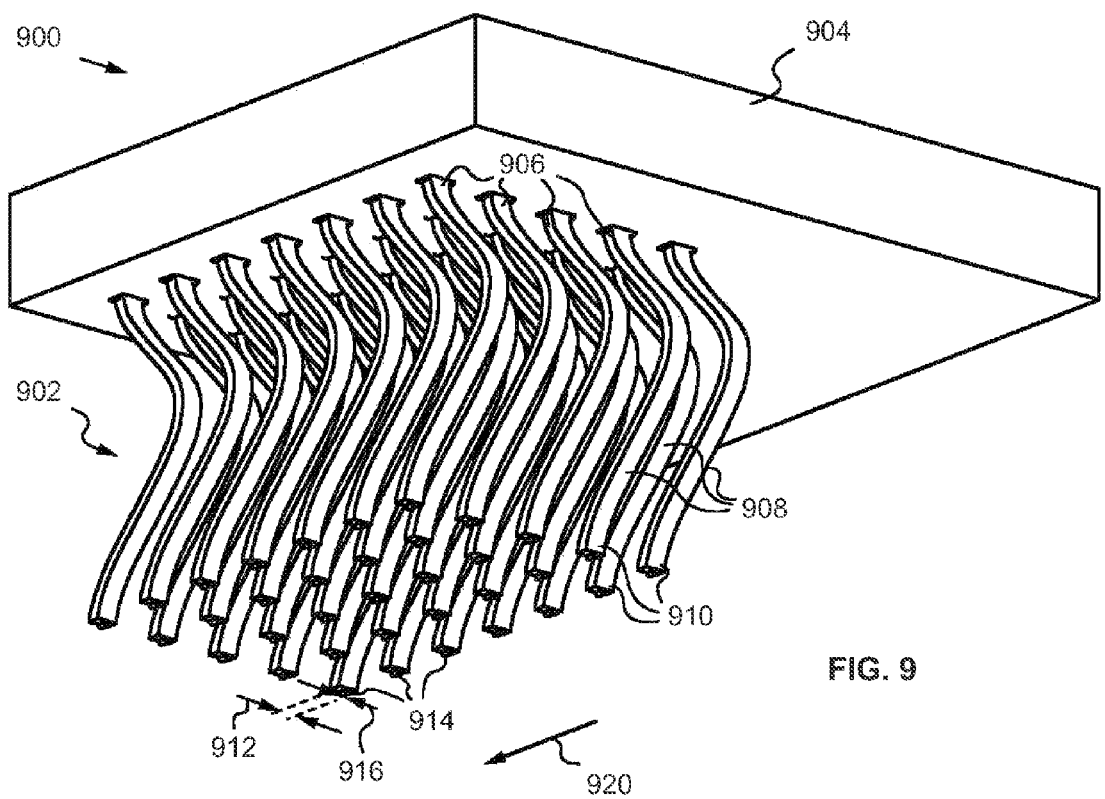
FIG. 9 is a three-dimensional view of a portion of a probe card employing probes with blunt skates according to the invention.

A portion of a probe card assembly 900 employing probes 902 according to the invention is shown in FIG. 9. Assembly 900 has a block 904 for holding probes 902 by their contact ends 906. A space transformer, electro-mechanical arrangements as well as a source for providing a test current i to be applied to contact ends 906 are not shown in this drawing for reasons of clarity.

Probes 902 have electrically conductive bodies 908 that end in contacting tips 910 of a tip width 912. Bodies 908 have suitable mechanical properties for engaging with conductive pads or bumps of a device under test (DUT). For example, bodies 908 can be straight, bent or have more complex geometries to ensure sufficient mechanical strength and compliance, as will be appreciated by those skilled in the art. In fact, although probes 902 have bodies 908 that are bent in the present embodiment, the invention can be practiced with probes of any geometry.

Tips 910 terminate in blunt skates 914 that are narrower than tip width 912. In fact, skate width 916 is typically a fraction of tip width 912. For example, tip width 912 can be on the order of 75 µm while skate width 916 is about 12 µm or less. Skates 914 are aligned along a scrub direction 920 indicated by an arrow.

Figure 10A:
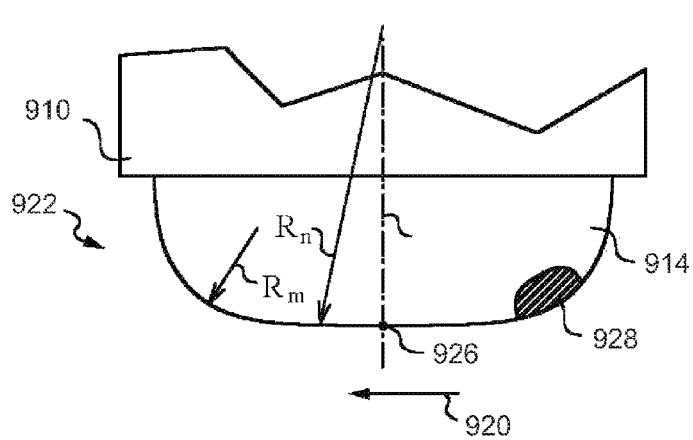
FIG. 10A is a plan side view of a contacting tip of a single probe from FIG. 9 equipped with a blunt skate.

As better shown in the plan side view of FIG. 10A, each blunt skate 914 has a certain curvature along scrub direction 920. In other words, the ridge of skate 914 that is aligned with scrub direction 920 has a certain curvature along that direction. The curvature is defined in such a way as to produce a self-cleaning rotation sometimes also referred to as pivoting or rocking motion of skate 914. In the present embodiment, the curvature has a variable radius of curvature R that decreases toward a front 922 of skate 914. More specifically, the radius of curvature has a small value $R_m$ at front 922 and a larger value $R_n$ near the center of skate 914.

Skate 914 in the present embodiment is symmetric about a center line 924 that passes through a midpoint 926 of skate 914. Therefore, the same variable radius of curvature is found in the back half of skate 914. It is important that the curvature at every point along skate 914 that will engage with a pad is sufficiently large to avoid single point of contact or knife edge effects. These effects cause large amounts of local stress to develop in the pad and in the case of low-K pads can cause damage. Such effects are especially likely to develop along skate 914 at front and back regions, such as region 928 indicated in hatching. To further help avoid these effects, the cross-section of skate 914 has a rounded rather than a flat cross section, as better visualized in the front cross-sectional view of FIG. 10B.

Figure 11A:
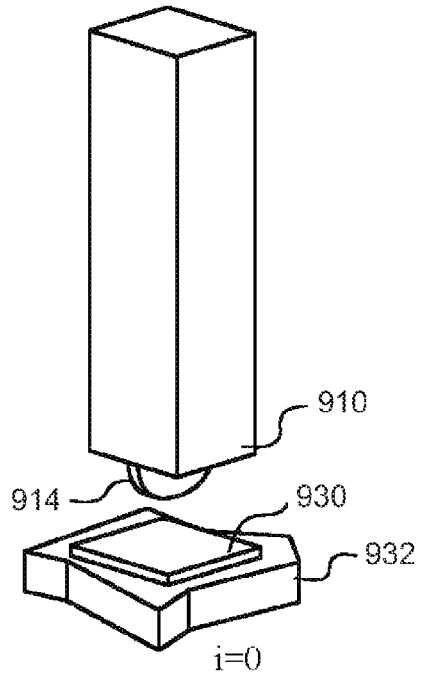

The operation of probes 902 will be explained in reference to the three-dimensional views shown in FIGS. 11A-D. In FIG. 11A contacting tip 910 with blunt skate 914 is positioned above a conductive pad 930 of a device under test (DUT) 932. Only a portion of DUT 932 is shown for clarity. In this position, no test current i is applied (i=0) to probe 902.

It is understood that DUT 932 can be any device that requires electrical testing including, for example, a semiconductor wafer bearing integrated circuits. Also, it is understood that pad 930 can have any geometry and can also be in the form of a solder bump or any other form suitable for establishing electrical contact. In the present embodiment pad 930 is a low-K conductive pad.

Figure 11B:
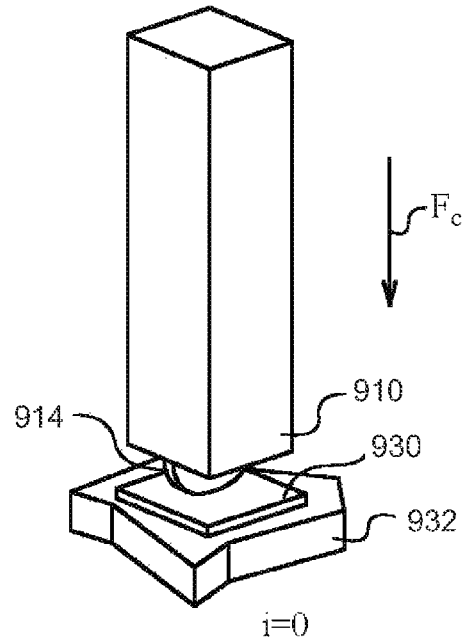

In FIG. 11B a contact force $F_c$ is applied between blunt skate 914 and low-K conductive pad 930. This force can be delivered by any suitable mechanism well-known to an artisan skilled in the art. At this time, there is still no test current applied (i=0).

Figure 11C:
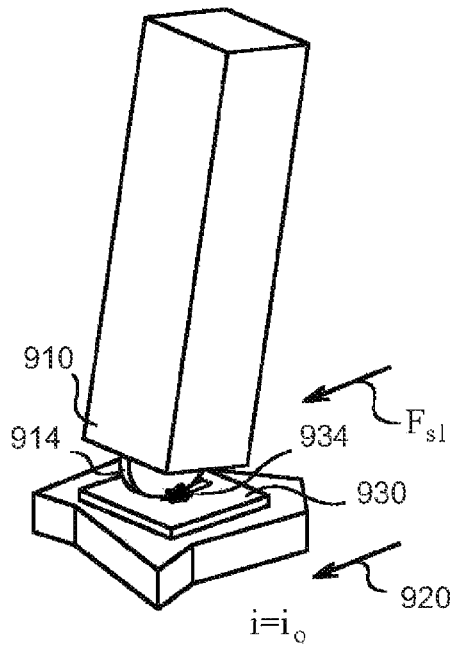

FIG. 11C illustrates how tip 910 pivots and skate 914 performs a scrub motion along scrub direction 920. The scrub motion is caused by a scrub force $F_{s1}$ that is due to contact force $F_c$. The purpose of scrub motion of skate 914 is to clear oxide from pad 930 to establish electrical contact between skate 914 and pad 930. The alignment of skate 914 with scrub direction 920 and the geometry of skate 914, namely its curvature causes the scrub motion to be accompanied by a self-cleaning rotation or pivoting of skate 914.

The self-cleaning rotation removes debris 934 that is accumulated on skate 914 or that is originally located on pad 930 from skate 914. Typically, debris 934 accumulates on skate 914 during previous engagements with or touch-downs on pads. The self-cleaning rotation pushes debris 934 to the back and off the sides of skate 914. Removal of debris 934 from the skate-pad interface enables a low contact resistance $R_c$ to be preserved between skate 914 and pad 930. Once such low contact resistance $R_c$ has been established, a test current i=$i_o$ is applied to pad 930.

Figure 11D:
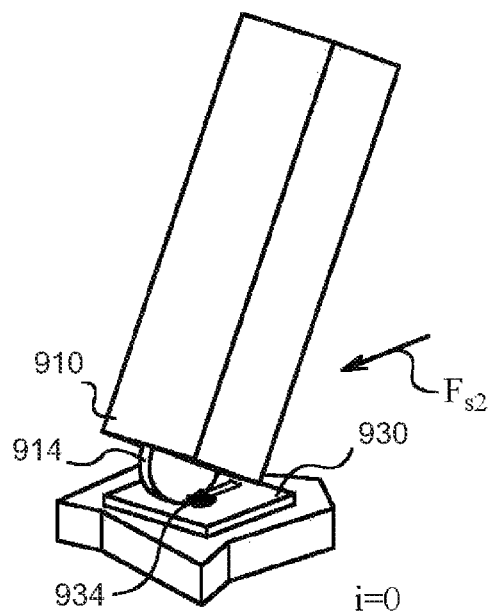

FIG. 11D shows the effects of augmenting contact force $F_c$ to further increase the self-cleaning rotation of skate 914. This can be done whenever excess of debris 934 accumulates on skate 914. In a preferred embodiment of the method of invention, contact force $F_c$ is augmented after a certain number of touch-down cycles or whenever the contact resistance is observed to reach unacceptable levels. This may occur after two or more touch-down cycles or when resuming testing after a long stand-by period. Note that the resultant scrub force $F_{s2}$ is larger as a result of the increased contact force $F_c$ and that no test current (i=0) is applied during this procedure.

A graph 940 in FIG. 12 shows the contact resistance $R_c$ between a typical flat prior art contacting tip and a conductive pad as a function of touch-down cycles. Clearly, contact resistance $R_o$ increases from a nominal value $R_o$ of about 1µ as a function of cycles n. The slope of the increase grows as a function of n until reaching a maximum resistance $R_{max}$. Testing the pads becomes impossible once contact resistance $R_c$ reaches $R_{max}$. At this point, the prior art tips are sanded down to remove debris and recover nominal contact resistance $R_o$. This corresponds to the dashed portion 942 of graph 940. Unfortunately, sanding down accelerates the accumulation of debris on the tip. This causes the slope of contact resistance increase to become steeper and reach the unacceptably high value $R_{max}$ even sooner. Another sanding denoted by dashed portion 944 is required to again recover nominal resistance $R_o$.

FIG. 13 shows an exemplary graph 950 of contact resistance $R_c$ between contacting tip 910 with blunt skate 914 in accordance with the invention and a conductive pad. As contact resistance $R_c$ increases from nominal value $R_o$, the self-cleaning rotation of skate 914 tends to restore it to $R_o$. In some cases no additional intervention is necessary. If $R_c$ does begin to grow too much and an immediate decrease of contact resistance $R_c$ is desired, then the contact force $F_c$ is augmented to increase the self-cleaning rotation of skate 914. Portions 952 of graph 950 visualize the corresponding reductions of contact resistance $R_c$ to nominal value $R_o$.

FIG. 14 shows a comparison in the concentration of mechanical stress caused in low-K conductive pad 930 by a prior art chisel probe tip 960 and a blunt skate 962 with a flat cross-section in accordance with the present invention. Pad 930 is made of aluminum and both tip 960 and skate 962 are made of Rhodium. Chisel probe tip 960 has a 60 degree taper angle, a 2 mil radius at its contact tip and is 60 μm long. Skate 962 is 10 μm wide, its ends are rounded with a 10 mil radius of curvature and it is also 60 μm long. The contact force $F_c$ applied in each case is 8 g. The stress caused by prior art chisel probe tip 960 is very large and concentrated in the middle of pad 930. This causes mechanical failure of pad 930 by fracture. In contrast, the stress is well-distributed when blunt skate 914 according to the invention is used to establish electrical contact with pad 930.

Various types of probes can employ blunt skates according to the invention, as illustrated in FIGS. 15A-D. In some embodiments a probe 1500 is made of several material layers 1502, 1504, 1506, as illustrated in FIG. 15A. Such layers can be grown, e.g., in a deposition process. In these embodiments a blunt skate 1508 can be formed at a tip 1510 from an extension of one of the material layers. In the embodiment shown, it is the extension of the central or sandwiched material layer 1504 that forms skate 1508. The most appropriate material layer for forming a blunt skate from its extension is a hard conductive material such as rhodium or cobalt. In fact, material layer 1504 is made of rhodium in the present embodiment. In alternative probes having more layers extensions of other than central layers can be used. In fact, even the outer-most layers may be extended to form blunt skates according to the invention.

FIG. 15B illustrates a probe 1520 with a laser machined blunt skate 1522. For example, skate 1522 has a higher aspect ratio than previous skates and also a single radius of curvature. Such geometry can be employed when relatively short scrub motion is imposed by a higher pitch of conductive pads. In fact, the curvature of skate 1522 can be adjusted in concert with the characteristics of the scrub motion as conditioned by the geometry of the probe. These characteristics may include, among other, scrub length, scrub depth and scrub velocity.

In either the layered probe embodiments or still other embodiments it is possible to provide two or more blunt skates, as illustrated by probe 1530 of FIG. 15C. Probe 1530 is made of three material layers 1532, 1534, 1536 and of those the side layers 1532, 1536 are extended to form blunt skates 1538, 1540. Skates 1538, 1540 are arranged parallel to each other and along the scrub direction. Of course, more than two skates 1538, 1540 can be accommodated on the tip of a probe when more material layers are available.

Still another alternative embodiment is shown in FIG. 15D. Probe 1550 shown here has five material layers 1552, 1554, 1556, 1558 and 1560 with layers 1552, 1556 and 1560 being extended. Three blunt skates 1562, 1564, 1566 are formed from extensions of layers 1552, 1556, 1560. These skates are also parallel to each other, but in addition they are staggered along the scrub direction.

A person skilled in the art will appreciate that various other combinations of skates are possible. In addition, the blunt skates can be employed at the tips of various types of probes, including probes that are linear or bent. For example, zig-zag probes, S-shaped probes or probes with a knee can employ one or more blunt skates each to improve contact resistance with the pads of the DUTs. Also, when equipped with the blunt skates of the invention, these probes can be used to contact more fragile conductive pads, e.g., very thin pads or pads that use relatively soft metals.

Figure 10B:
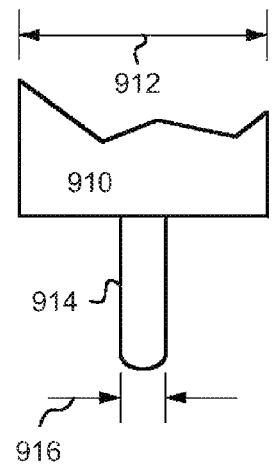
FIG. 10B is a front cross-sectional view of the contacting tip of the single probe from FIG. 9.

FIGS. 16A-B are microscope images of a preferred embodiment of a blunt skate that has a rounded cross-section, similar to the skate described in FIGS. 10A-B. FIG. 16A shows the skate prior to use and FIG. 16B shows it after one million touch-down cycles. The skate has a width of about 10 μm and a length of 200 μm. Note how the skate is free of debris even after the one million touch-down cycles. In fact, the debris has a tendency to be pushed off to the sides of the skate and attach to non-critical portions of the probe tip.

The probe card requires appropriate design and devices, such as a source for delivering the test current i as well as arrangements for providing the overdrive to apply the contact force between the probes and the pads of the DUT. The design of probe cards as well as the aforementioned devices are well-known to those skilled in the art. It will be appreciated by those skilled artisans that probes equipped with blunt skates in according to the invention can be employed in probe cards of various designs, including probe cards with and without space transformers. The probes themselves can be removable in embodiments that use space transformers or they can be permanently attached using soldering techniques or mechanical locking such as press fit into a conductive via.

The probes of invention are thus very versatile and are able to establish reliable electrical contact with even densely spaced fragile conductive pads or low-K pads. The pads can be arranged in accordance with various geometries, including dense arrays. They are able to do that because the combined scrub motion and self-cleaning rotation of the blunt skate does not cause a high stress concentration in the pad. Due to the large number of possible variations and types of probes that employ blunt skates, the scope of the invention should be judged by the appended claims and their legal equivalents.

What is claimed is:

1. A probe assembly for testing a device under test comprising:
   a fixture plate for holding a plurality of probes, said fixture plate comprising:
      a first fixture surface comprising a primary positioning hole arrayed with a positioning hole pitch;
      a second fixture surface in a substantially non-parallel fixture surface angle to said first fixture surface;
   said at least one of said plurality of probes disposed on said fixture plate, said probe comprising:
      an offset arm extending outwardly in a first direction;
      a suspension structure comprising one end at said offset arm and an opposing tip end, said opposing tip end comprising a tip positioning pin;
      said suspension structure extending downwardly from said offset arm in a second direction; and
      said suspension structure further extending outwardly at said tip end in substantially said first direction.

2. The probe assembly of claim 1 wherein said probe further comprises an elbow between said offset arm and said suspension structure.

3. The probe assembly of claim 1 wherein said tip positioning pin is configured for insertion in a tip pin hole along a contacting axis.

4. The probe assembly of claim 1 wherein said tip positioning pin comprises a rectangular cross section.

5. The probe assembly of claim 1 wherein said tip positioning pin comprises a square cross section.

6. The probe assembly of claim 1 wherein said probe further comprises an elbow positioning pin extending from said offset arm.

7. The probe assembly of claim 1 wherein said probe comprises a center layer comprising said tip positioning pin interposed between outer layers.

8. The probe assembly of claim 6 wherein said elbow positioning pin is disposed in said primary positioning hole.

9. The probe assembly of claim 1 further comprising a sacrificial assembly plate separably attached to an attachment face of said fixture plate.

10. The probe assembly of claim 9 further comprising a sacrificial spacing structure interposed between said probe fixture plate and said sacrificial assembly plate.

11. The probe assembly of claim 9 wherein said attachment face is opposite of said first fixture surface.

12. The probe assembly of claim 9 wherein said sacrificial assembly plate comprises a third surface having a secondary positioning hole offset to said primary positioning hole.

13. The probe assembly of claim 12 wherein said third surface comprises a surface offset to said first fixture surface in a direction of said primary positioning hole and said secondary positioning hole.

14. The probe assembly of claim 12 wherein said probe comprises a tip positioning pin disposed in said secondary positioning hole.

15. The probe assembly of claim 14 wherein said first fixture surface comprises an alignment hole and an orienting hole defining a first positioning axis.

16. The probe assembly of claim 15 wherein a second alignment hole and a second orienting hole define a second positioning axis in a fan-out angle to said first positioning axis such that an alignment hole distance between said at least one alignment hole and said second alignment hole is substantially smaller than an orienting hole distance between said at least one orienting hole and said second orienting hole.

17. The probe assembly of claim 15 wherein said alignment hole distance is about the same as said positioning hole pitch.

18. The probe assembly of claim 15 further comprising a fan-out beam.

19. The probe assembly of claim 18 wherein said fan-out beam comprises a probe connect end and a peripheral connect end on a connect surface.

20. The probe assembly of claim 19 wherein said fan-out beam comprises a beam attachment face opposite said connect surface.

21. The probe assembly of claim 20 wherein said beam attachment face comprises an elbow alignment pin in proximity to said probe connect end.

22. The probe assembly of claim 21 wherein said elbow alignment pin is disposed in said alignment hole.

23. The probe assembly of claim 19 further comprising conductive bridges to establish a conductive path between said tip positioning pins and said peripheral connect ends.

24. The probe assembly of claim 18 wherein said fan-out beam is disposed on said first fixture surface.

25. The probe assembly of claim 18 wherein said fan-out beam further comprises an orienting pin.

26. The probe assembly of claim 25 wherein said orienting pin is disposed in said orienting hole of said first fixture surface.

27. The probe assembly of claim 1 wherein said second fixture surface extends in a substantially constant offset in a direction of said primary positioning holes.

28. The probe assembly of claim 1 wherein said primary positioning hole is linearly arrayed.

29. The probe assembly of claim 1 wherein said second surface is substantially planar.

30. The probe assembly of claim 1 wherein said first fixture plate is substantially perpendicular to said second fixture surface.

31. A layered probe for testing a device under test comprising:
an offset arm extending outwardly in a first direction;
an elbow positioning pin extending from said offset arm;
a suspension structure comprising one end at said offset arm and an opposing tip end, said opposing tip end comprising a tip positioning pin;
said suspension structure extending downwardly from said offset arm in a second direction;
said suspension structure further extending outwardly at said tip end in substantially said first direction; and
said layered probe comprising a center layer comprising said tip positioning pin interposed between outer layers.

32. The probe of claim 31 further comprising an elbow between said offset arm and said suspension structure.

33. The probe of claim 31 wherein said tip positioning pin is configured for insertion in a tip pin hole along a contacting axis.

34. The probe of claim 31 wherein said tip positioning pin comprises a rectangular cross section.

35. The probe of claim 31 wherein said tip positioning pin comprises a square cross section.

36. The probe of claim 31 wherein said elbow positioning pin is inserted in an elbow pin hole.

37. The probe of claim 31 further comprising a fixed probe assembly, wherein said fixed probe assembly comprises a fixture plate for holding a plurality of probes, said probe disposed on said fixture plate.

38. The probe of claim 37 wherein said fixture plate comprises:
a first fixture surface comprising a primary positioning hole arrayed with a positioning hole pitch; and
a second fixture surface in a substantially non-parallel fixture surface angle to said first fixture surface.

39. The probe of claim 38 wherein said elbow positioning pin is disposed in said primary positioning hole.

40. The probe of claim 38 further comprising a sacrificial assembly plate separably attached to an attachment face of said fixture plate.

41. The probe of claim 40 further comprising a sacrificial spacing structure interposed between said probe fixture plate and said sacrificial assembly plate.

42. The probe of claim 40 wherein said attachment face is opposite of said first fixture surface.

43. The probe of claim 40 wherein said sacrificial assembly plate comprises a third surface having a secondary positioning hole offset to said primary positioning hole.

44. The probe of claim 43 wherein said third surface comprises a surface offset to said first fixture surface in a direction of said primary positioning hole and said secondary positioning hole.

45. The probe of claim 43 wherein said tip positioning pin disposed in said secondary positioning hole.

46. The probe of claim 45 wherein said first fixture surface comprises an alignment hole and an orienting hole defining a first positioning axis.

47. The probe of claim 46 wherein a second alignment hole and a second orienting hole define a second positioning axis in a fan-out angle to said first positioning axis such that an alignment hole distance between said at least one alignment hole and said second alignment hole is substantially smaller than an orienting hole distance between said at least one orienting hole and said second orienting hole.

48. The probe of claim 46 wherein said alignment hole distance is about the same as a positioning hole pitch.

49. The probe of claim 46 further comprising a fan-out beam.

50. The probe of claim 49 wherein said fan-out beam comprises a probe connect end and a peripheral connect end on a connect surface.

51. The probe of claim 50 wherein said fan-out beam comprises a beam attachment face opposite said connect surface.

52. The probe of claim 51 wherein said beam attachment face comprises an elbow alignment pin in proximity to said probe connect end.

53. The probe of claim 52 wherein said elbow alignment pin is disposed in said alignment hole.

54. The probe of claim 50 further comprising conductive bridges to establish a conductive path between said tip positioning pins and said peripheral connect ends.

55. The probe of claim 49 wherein said fan-out beam is disposed on said first fixture surface.

56. The probe of claim 49 wherein said fan-out beam further comprises an orienting pin.

57. The probe of claim 56 wherein said orienting pin is disposed in said orienting hole of said first fixture surface.

58. The probe of claim 38 wherein said second fixture surface extends in a substantially constant offset in a direction of said primary positioning holes.

59. The probe of claim 38 wherein said primary positioning hole is linearly arrayed.

60. The probe of claim 38 wherein said second surface is substantially planar.

61. The probe of claim 38 wherein said first fixture plate is substantially perpendicular to said second fixture surface.

62. The probe of claim 31 wherein said offset arm is substantially rigid.

63. The probe of claim 62 wherein said suspension structure and tip end are substantially rigid.

64. The probe of claim 31 wherein said probe is substantially symmetric about a symmetry plane.

65. The probe of claim 31 wherein said suspension structure comprises a cantilever.

66. The probe of claim 31 wherein said suspension structure comprises a knee suspension.

67. The probe of claim 31 wherein said suspension structure comprises a bend.

68. The probe of claim 31 wherein said first direction is substantially horizontal.

69. The probe of claim 31 wherein said second direction is substantially vertical.

70. The probe of claim 31 wherein said tip positioning pin is discrete from said opposing tip end.

\* \* \* \* \*